(12) United States Patent
Sun et al.

(10) Patent No.: US 12,339,540 B2
(45) Date of Patent: Jun. 24, 2025

(54) LIGHT EMITTING MODULE AND DRIVING ASSEMBLY THEREOF, AND DISPLAY DEVICE

(71) Applicants: Beijing BOE Display Technology Co., Ltd., Beijing (CN); BOE Technology Group Co., Ltd., Beijing (CN)

(72) Inventors: Wei Sun, Beijing (CN); Lianghao Zhang, Beijing (CN); Xin Duan, Beijing (CN); Zhaohui Meng, Beijing (CN); Shuhuan Yu, Beijing (CN); Ying Zhou, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/023,639

(22) PCT Filed: Jun. 29, 2022

(86) PCT No.: PCT/CN2022/102408
§ 371 (c)(1),
(2) Date: Feb. 27, 2023

(87) PCT Pub. No.: WO2024/000282
PCT Pub. Date: Jan. 4, 2024

(65) Prior Publication Data
US 2024/0272481 A1   Aug. 15, 2024

(51) Int. Cl.
*G02F 1/1335* (2006.01)
*G02F 1/13357* (2006.01)
(Continued)

(52) U.S. Cl.
CPC ......... *G02F 1/133612* (2021.01); *G09G 3/32* (2013.01); *G09G 3/3426* (2013.01);
(Continued)

(58) Field of Classification Search
CPC ......... G02F 1/133612; G02F 1/133603; G02F 1/133611; G02F 1/1336; G09G 3/32;
(Continued)

(56) References Cited

U.S. PATENT DOCUMENTS

| | | |
|---|---|---|
| 2008/0231560 A1 | 9/2008 | Yamashita et al. |
| 2010/0134406 A1 | 6/2010 | Maruyama et al. |

(Continued)

FOREIGN PATENT DOCUMENTS

| | | |
|---|---|---|
| CN | 102402957 A | 4/2012 |
| CN | 101800030 B | 6/2012 |

(Continued)

OTHER PUBLICATIONS

Written Opinion of the International Search Authority issue to PCT/CN2022/102408 dated Dec. 19, 2022 with English translation, (4p).

(Continued)

*Primary Examiner* — Douglas M Wilson
(74) *Attorney, Agent, or Firm* — Arch & Lake LLP

(57) ABSTRACT

A driving assembly includes a main control chip, a circuit selection chipset and a channel chipset. The circuit selection chipset includes more than one circuit selection chip used to be electrically connected with each light source voltage line in one-to-one correspondence, and is configured to enable each circuit selection chip to load the light source voltage to the connected light source voltage line one by one under control of the main control chip; the channel chipset includes more than one channel control chip, each channel control chip is used to be electrically connected with one or more channel lines; the channel chipset is configured to enable the channel control chip to control driving current on each connected channel line under control of the main control chip.

20 Claims, 10 Drawing Sheets

(51) Int. Cl.
*G09G 3/32* (2016.01)
*G09G 3/34* (2006.01)
*H01L 25/16* (2023.01)
*H05B 45/10* (2020.01)
*H05B 45/30* (2020.01)
*H05B 47/16* (2020.01)
*G09G 3/36* (2006.01)

(52) U.S. Cl.
CPC ......... *H05B 47/16* (2020.01); *G02F 1/1336* (2013.01); *G02F 1/133603* (2013.01); *G02F 1/133611* (2013.01); *G09G 3/36* (2013.01); *G09G 2320/064* (2013.01); *H01L 25/167* (2013.01); *H05B 45/10* (2020.01); *H05B 45/30* (2020.01)

(58) Field of Classification Search
CPC ......... G09G 3/3426; G09G 2320/0233; G09G 2320/064; G09G 3/36; H05B 47/16; H05B 45/10; H05B 45/30; H01L 25/167
See application file for complete search history.

(56) References Cited

U.S. PATENT DOCUMENTS

| | | |
|---|---|---|
| 2015/0015565 A1 | 1/2015 | Yamashita et al. |
| 2019/0057653 A1 | 2/2019 | Yamashita et al. |
| 2019/0159311 A1 | 5/2019 | Zhang et al. |
| 2019/0180700 A1* | 6/2019 | Gu ................. G09G 3/3426 |
| 2020/0090608 A1* | 3/2020 | Calayir ............. H05B 45/32 |
| 2021/0018795 A1* | 1/2021 | Calayir ............. H05B 45/10 |
| 2021/0063822 A1 | 3/2021 | Wang et al. |
| 2021/0233968 A1 | 7/2021 | Yang et al. |
| 2021/0407441 A1 | 12/2021 | Gu et al. |
| 2022/0085000 A1* | 3/2022 | Yao ................. H01L 23/4985 |

FOREIGN PATENT DOCUMENTS

| | | |
|---|---|---|
| CN | 202871258 U | 4/2013 |
| CN | 105657905 A | 6/2016 |
| CN | 107945748 A | 4/2018 |
| CN | 108399897 A | 8/2018 |
| CN | 108803149 A | 11/2018 |
| CN | 110415641 A | 11/2019 |
| CN | 111091787 A | 5/2020 |
| CN | 111653230 A | 9/2020 |
| CN | 112669767 A | 4/2021 |
| CN | 112684631 A | 4/2021 |
| CN | 112908249 A | 6/2021 |
| CN | 113539168 A | 10/2021 |
| CN | 114512062 A | 5/2022 |
| KR | 102363928 B1 | 2/2022 |

OTHER PUBLICATIONS

Extended European Search report issued in Application No. EP22948397.9, dated Mar. 10, 2025, (12p).

* cited by examiner

LIGHT EMITTING MODULE AND DRIVING ASSEMBLY THEREOF, AND DISPLAY DEVICE

CROSS REFERENCE

The present disclosure is a National Stage of International Application No. PCT/CN2022/102408, filed on Jun. 29, 2022, the entire contents of which are incorporated herein by reference.

TECHNICAL FIELD

The present disclosure relates to the field of display technology, in particular, to a light emitting module, a driving assembly thereof, and a display device.

BACKGROUND

In a passively driven lamp board, the lamp board is provided with a large number of anode lines and cathode lines, the anode of the light source is electrically connected to the anode lines, and the cathode is electrically connected to the cathode lines. Correspondingly, the driving chip needs to be provided with a large number of pins to control the anode lines and the cathode lines respectively.

It should be noted that the information disclosed in the above background section is for enhancing the understanding of the background of the present disclosure, and therefore may include information that does not constitute the related art known to those of ordinary skill in the art.

SUMMARY

According to one aspect of the present disclosure, there is provided a driving assembly of a light emitting module, the light emitting module further includes a light emitting substrate; the light emitting substrate includes more than one light source voltage line extending along a first direction and more than one channel line extending along a second direction, and includes more than one light emitting circuit distributed in an array; an end of any light emitting circuit is connected to the light source voltage line and another end is connected to the channel line; one of the first direction and the second direction is a row direction, and the other is a column direction;

the driving assembly includes a main control chip, a circuit selection chipset and a channel chipset;

the circuit selection chipset includes more than one circuit selection chip used to be electrically connected with each light source voltage line in one-to-one correspondence, and is configured to enable each circuit selection chip to load a light source voltage to the connected light source voltage line one by one under control of the main control chip;

the channel chipset includes more than one channel control chip, and each channel control chip is used to be electrically connected with one or more channel lines; the channel chipset is configured to enable the channel control chip to control driving current on each connected channel line under the control of the main control chip.

According to some embodiments of the present disclosure, the driving assembly further includes a flexible circuit board used to be bound and connected with the light emitting substrate, and the main control chip is provided on the flexible circuit board;

the circuit selection chip and the channel control chip are used to be bound to the light emitting substrate, and are electrically connected to the flexible circuit board through a line provided on the light emitting substrate.

According to some embodiments of the present disclosure, the circuit selection chipset is used to be provided on an end of the light emitting substrate in the first direction; the channel chipset is used to be provided on an end of the light emitting substrate in the second direction.

According to some embodiments of the present disclosure, the circuit selection chip is a pure analog module, including a selection control module and a voltage output unit; a control end of the voltage output unit is electrically connected to the selection control module, a first end of the voltage output unit is used to load the light source voltage, and a second end of the voltage output unit is used to be electrically connected to the light source voltage line;

the selection control module is configured to enable the voltage output unit to be electrically turned on under control of a clock signal and a column start signal, so that the circuit selection chip loads the light source voltage to the light source voltage line.

According to some embodiments of the present disclosure, the circuit selection chip includes a light source voltage input pin for loading the light source voltage, a clock pin for loading the clock signal, a column start signal pin for loading the column start signal and an output pin for electrical connection with the light source voltage line;

each circuit selection chip in the circuit selection chipset is cascaded in sequence; where, the clock pin of each circuit selection chip is used to load the clock signal from the main control chip; the column start signal pin of the circuit selection chip at a first stage is used to load the column start signal from the main control chip; in circuit selection chips at two adjacent stages, the output pin of the circuit selection chip at an upper stage is electrically connected with the column start signal pin of the circuit selection chip at a lower stage, so that output of the circuit selection chip at the upper stage is used as the column start signal of the circuit selection chip at the lower stage.

According to some embodiments of the present disclosure, the channel control chip includes a synchronous clock pin, a data pin and an output pin; the channel control chip is configured to, within a data transmission stage, obtain first driving data received, and forward each subsequent driving data through the output pin after obtaining driving data;

each channel control chip in the channel chipset is cascaded in sequence; where, the synchronous clock pin of each channel control chip is used to receive the synchronous clock signal from the main control chip; the data pin of the channel control chip at a first stage is used to receive driving data from the main control chip; in channel control chips at two adjacent stages, the output pin of the channel control chip at an upper stage is electrically connected to the data pin of the channel control chip at a lower stage.

According to some embodiments of the present disclosure, the driving assembly of the lighting module according to claim 1, where the channel control chip includes at least one driving unit set, and the driving unit set includes a waveform modulation unit, an output control unit and a waveform control unit;

a first end of the waveform control unit is used to load a voltage signal capable of turning on the output control unit electrically, a control end of the waveform control unit is electrically connected to the waveform modulation unit, and a second end of the waveform control unit end is electrically connected to a control end of the output control unit; a first end of the output control unit is used to be electrically connected to the channel line, and a second end of the output control unit is used to load ground voltage;

a logic module of the channel control chip is configured to obtain a waveform modulation signal according to the driving data being obtained; the waveform modulation unit is used to control an electrical turn-on state of the waveform control unit according to the waveform modulation signal.

According to some embodiments of the present disclosure, the waveform control unit and the output control unit are both MOS transistors.

According to some embodiments of the present disclosure, the driving unit set further includes a power amplifier, an input end of the power amplifier is electrically connected to the logic module of the channel control chip, and an output end of the power amplifier is electrically connected with the first end of the waveform control unit.

According to some embodiments of the present disclosure, the driving unit set further includes a source current control unit;

a first end of the source current control unit is electrically connected to a second end of the output control unit, a second end of the source current control unit is used to load the ground voltage, and a control end of the source current control unit is electrically connected to the logic module of the channel control chip;

the logic module of the channel control chip is configured to obtain an amplitude control signal according to the driving data being obtained and send to the source current control unit;

the source current control unit is used to control a magnitude of current flowing through the source current control unit according to the amplitude control signal.

According to some embodiments of the present disclosure, the driving unit set further includes a local dimming unit, and an input end of the local dimming unit is electrically connected to the logic module of the channel control chip, an output end of the local dimming unit is electrically connected to the first end of the waveform control unit;

the logic module of the channel control chip is configured to obtain an amplitude modulation signal according to the driving data being obtained and send to the local dimming unit;

the local dimming unit is used to output different voltage signals according to the amplitude modulation signal, so as to control a current amplitude of the output control unit when electrically turned on.

According to some embodiments of the present disclosure, the driving unit set further includes a source current control unit;

a first end of the source current control unit is electrically connected to a second end of the output control unit, a second end of the source current control unit is used to load the ground voltage, and a control end of the source current control unit is electrically connected to the logic module of the channel control chip;

the logic module of the channel control chip is configured to obtain an amplitude control signal according to the driving data being obtained and send to the source current control unit;

the source current control unit is used to control a magnitude of current flowing through the source current control unit according to the amplitude control signal.

According to some embodiments of the present disclosure, the driving unit set further includes a current detection unit;

the current detection unit is used to detect a current amplitude of the first end of the output control unit and feed back to the logic module of the channel control chip; the logic module of the channel control chip adjusts the amplitude modulation signal and/or the amplitude control signal based on feedback of the current detection unit.

According to some embodiments of the present disclosure, the channel control chip includes a driving unit set and more than one channel pin for connecting different channel lines respectively; the channel control chip further includes a switching unit;

the first end of the output control unit is electrically connected to the switching unit, and each channel pin is electrically connected to the switching unit; the switching unit is configured to enable each channel pin to be electrically connected with the switching unit one by one.

According to some embodiments of the present disclosure, the channel control chip includes more than one driving unit set and a channel pin corresponding to each driving unit set, and the channel pin is used to connect the channel line;

the first end of the output control unit of each driving unit set is electrically connected to the channel pin correspondingly.

According to some embodiments of the present disclosure, the circuit selection chip includes a logic module and an output control module;

the output control module is configured to output the light source voltage with a modulated current amplitude under control of the logic module.

According to some embodiments of the present disclosure, the circuit selection chip includes a synchronous clock pin, a data input pin and a data output pin;

the circuit selection chip is configured to, within a data transmission stage, obtain first driving data received by the data input pin and forward each subsequent driving data through the data output pin after obtaining the driving data;

each circuit selection chip in the circuit selection chipset is cascaded in sequence; where, the synchronous clock pin of each circuit selection chip is used to receive the synchronous clock signal from the main control chip; the data input pin of the circuit selection chip at a first stage is used to receive the driving data from the main control chip; in circuit selection chips at two adjacent stages, the data output pin of the circuit selection chip at an upper stage is electrically connected to the data input pin of the circuit selection chip at a lower stage.

According to some embodiments of the present disclosure, the logic module of the circuit selection chip includes a selection control module and a current control register; the output control module of the circuit selection chip includes a power amplifier, a local dimming unit, and a voltage output unit;

where, an input end of the local dimming unit is used to load a substrate power voltage; an output end of the local dimming unit is electrically connected to a control end of the voltage output unit;

a first control end of the local dimming unit is electrically connected to the current control register, and is used to control magnitude of an voltage signal being output under control of the current control register, so as to control amplitude of current flowing through the voltage output unit when the voltage output unit is electrically turned on; a second control end of the local dimming unit is electrically connected to the power amplifier, and is used to output the voltage signal under control of the power amplifier; the power amplifier is electrically connected to the selection control module; a first end of the voltage output unit is used to be electrically connected to the light source voltage line, and a second end of the voltage output unit is used to load the light source voltage;

the logic module of the circuit selection chip is configured to obtain timing information and amplitude information according to the driving data being obtained; the selection control module is used to control the power amplifier according to the timing information, so as to control the circuit selection chip whether to output the light source voltage; the current control register is used to control the second control end of the local dimming unit according to the amplitude information, so as to control amplitude of current output by the circuit selection chip.

According to some embodiments of the present disclosure, the main control chip is configured to enable to provide the clock signal and the column start signal to the circuit selection chipset.

According to some embodiments of the present disclosure, the main control chip is configured to enable to provide each driving data required by the circuit selection chipset to the circuit selection chipset;

the circuit selection chip is able to output a light source voltage with a modulated current amplitude according to the driving data being obtained.

According to some embodiments of the present disclosure, the driving data sent by the main control chip to the circuit selection chip includes timing information and amplitude information required by the circuit selection chip; the timing information is used to control timing for the circuit selection chip to output the light source voltage, and the amplitude information is used to control amplitude of current output by the circuit selection chip.

According to some embodiments of the present disclosure, the main control chip is configured to enable to provide each driving data required by the channel chipset to the channel chipset, and the driving data includes waveform modulation information;

the channel control chip is able to obtain a waveform modulation signal according to the driving data being obtained, and control a waveform of driving current on the channel line based on the waveform modulation signal.

According to some embodiments of the present disclosure, the main control chip is configured to enable to provide each driving data required by the channel chipset to the channel chipset, and the driving data includes current amplitude information;

the channel control chip is able to control current amplitude of driving current on the connected channel line according to the driving data being obtained.

According to some embodiments of the present disclosure, a number of the circuit selection chip in the circuit selection chipset is greater than a number of the channel control chip in the channel chipset.

According to a second aspect of the present disclosure, there is provided a light emitting module, including the above driving assembly and the light emitting substrate.

According to a third aspect of the present disclosure, there is provided a display device, including a liquid crystal display panel and a backlight module, where the backlight module includes the above-mentioned light emitting module.

It is to be understood that both the foregoing general description and the following detailed description are exemplary and explanatory and are not restrictive of the present disclosure.

BRIEF DESCRIPTION OF THE DRAWINGS

The accompanying drawings, which are incorporated in and constitute a part of the description, illustrate embodiments consistent with the disclosure and together with the description serve to explain the principles of the disclosure. Obviously, the drawings in the following description are some embodiments of the present disclosure, and for those of ordinary skill in the art, other drawings can also be obtained from these drawings without creative efforts.

DETAILED DESCRIPTION

Figure 1:
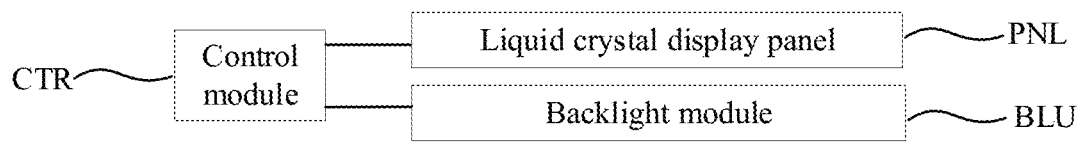
FIG. 1 is a schematic structural diagram of a display device in some embodiments of the present disclosure.

Example embodiments will now be described more fully with reference to the accompanying drawings. Example embodiments may, however, be embodied in many forms and should not be construed as limited to the embodiments set forth here; on the contrary, these embodiments are provided so that the present disclosure will be thorough and complete, and will fully convey the concept of example embodiments to those skilled in the art. The same reference numerals in the drawings denote the same or similar structures, and thus their detailed descriptions will be omitted. Furthermore, the drawings are merely schematic illustrations of the present disclosure and are not necessarily drawn to scale.

Although relative terms such as "upper" and "lower" are used in the description to describe the relative relationship of one component to another component shown in the drawings, these terms are used in the description for convenience, for example, according to the description in the accompanying drawings directions for the example described above. It will be appreciated that if the device shown in the drawings is turned over so that it is upside down, then elements described as being "upper" will become elements that are "lower". When a structure is "on" another structure, it may mean that a structure is integrally formed on another structure, or that a structure is "directly" placed on another structure, or that a structure is "indirectly" placed on another structure through another structure.

The terms "a", "an", "the", "said" and "at least one" are used to indicate the presence of one or more elements/components/etc.; the terms "comprising" and "including" are used to indicate the meaning of open inclusion and refer to the existence of other elements/components/etc., in addition to the listed elements/components/etc. The terms "first", "second" and "third" are used as marks, not as a limit on the quantity of the objects.

A transistor refers to an element including at least three ends of a gate electrode, a drain electrode, and a source electrode. The transistor has a channel region between a drain electrode (drain electrode end, drain region, or drain electrode) and a source electrode (source electrode end, source region, or source electrode), and current can flow through the drain electrode, the channel region, and the source electrode. The channel region refers to a region through which current mainly flows.

In the lamp board of the related art, the number of pins of the driving chip is too large and the chip area is too large, increasing the difficulty of binding and is not conducive to reducing the frame of the lamp board. The purpose of the present disclosure is to overcome the disadvantages of the above-mentioned related art, and provide a light emitting module, a driving assembly thereof, and a display device, so as to reduce the influence of the driving assembly on the frame of the light emitting substrate.

The present disclosure provides a display device, which includes a display module and a control module for driving the display module. Among them, the display module can be a liquid crystal display module, or a display module that directly displays through self-luminous light emitting elements (for example, a panel provided with LED, OLED, QLED, Micro LED, Mini LED, or other self-luminous elements in an array). In the embodiments of the present disclosure, the display device and its control module of the present disclosure are exemplarily described by taking the display module being a liquid crystal display module as an example.

FIG. 1 illustrates a schematic structural diagram of a display device in some embodiments of the present disclosure. In the example of FIG. 1, the display module includes a liquid crystal display panel and a backlight module BLU that provides backlight for the liquid crystal display panel; the control module CTR can simultaneously drive the liquid crystal display panel and the backlight module BLU. In other examples of the present disclosure, the display module can also be other types of display panels, such as OLED (Organic Light Emitting Diode) display panels, Micro LED (Micro Light Emitting Diode) display panels, QD-OLED (Quantum Dot-Organic Electroluminescent Diode) display panels, QLED (Quantum Dot Light Emitting diode) display panels, PLED (Polymer Organic Electroluminescent Diode) display panels, LED (Light Emitting Diode) display panels or other display panels with light emitting elements; at this time, the control module CTR can directly drive the light emitting elements on the display panel to realize screen display or lighting.

In the embodiments of the present disclosure, taking the display device being a liquid crystal display device as an example, the structure, function and driving method of the display device of the present disclosure are exemplarily introduced.

From the view of a stacked structure, the liquid crystal display panel may include an array substrate and a color film substrate stacked in sequence, and a closed box-shaped region defined by the array substrate, the color film substrate, and the frame sealant set between them. This region is filled with liquid crystal. Among them, the liquid crystal display panel further includes a first polarizer located on a side of the array substrate away from the color film substrate and a second polarizer located on a side of the color film substrate away from the array substrate. Pixel electrodes and a pixel driving circuit for loading data voltages to the pixel electrodes are arranged on the array substrate. Common electrodes are provided on the array substrate or the color film substrate. By controlling the electric field strength between the pixel electrode and the common electrode, the degree of twisting or lodging of the liquid crystal in the corresponding range of the pixel electrode can be adjusted, and then the polarization direction of the polarized light passing through the liquid crystal can be adjusted, and finally the light output rate of the liquid crystal display panel in the corresponding range of the pixel electrode can be adjusted.

Figure 2:
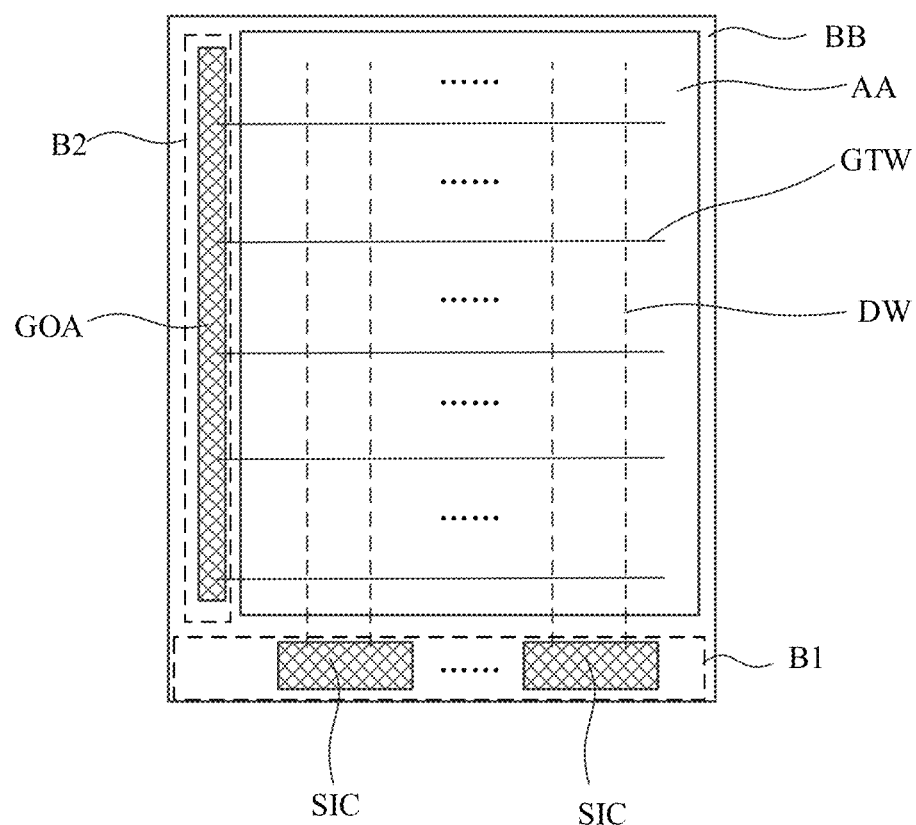
FIG. 2 is a schematic structural diagram of a liquid crystal display panel in some embodiments of the present disclosure.

FIG. 2 shows a schematic structural diagram of a liquid crystal display panel PNL in some embodiments of the present disclosure. From the view of a plan, the liquid crystal display panel PNL may include a display region AA and a peripheral region BB surrounding the display region AA. In the display region AA, the array substrate is provided with gate lines GTW extending along the row direction and data lines DW extending along the column direction. The gate lines GTW and the data lines DW define more than one pixel region, and the pixel electrode and the pixel driving circuit may be located in the pixel region. In an example, the pixel driving circuit may be a thin film transistor as a switching transistor, an end of the switching transistor is electrically connected to the data line DW, another end of the switching transistor is connected to the pixel electrode, and the gate of the switching transistor is connected to the gate line GTW. The peripheral region BB of the array substrate has a first peripheral region B1 bound with a source driving circuit SIC, and a second peripheral region B2 provided with a gate driving circuit GOA. Among them, the first peripheral region B1 extends along the column direction, and the second peripheral region B2 extends along the row direction. Among them, the gate driving circuit GOA is electrically connected to each gate line GTW, and is used to load a scan signal to the gate line GTW to turn on the switching transistor. The source driving circuit SIC is electrically connected to the data line DW, and is used to generate a data voltage according to the screen synchronization data and load it to the data line DW.

Referring to FIG. 2, in this example, there are more than one source driving circuit SIC of the liquid crystal display panel PNL, and each source driving circuit SIC can drive more than one data line DW respectively. Further, the source driving circuit SIC is a chip; the array substrate is provided with an FPC (flexible circuit board) binding region and a source driving circuit binding region in the first peripheral region B1. The source driving circuit SIC can be bound in the source driving circuit binding region, and the source driving circuit binding region is electrically connected with the data line DW and the flexible circuit board FPC binding region respectively through lines. The FPC binding region can be bound and connected with the control module CTR through the flexible circuit board. In this way, the signal and voltage of the control module CTR can be transmitted to the source driving circuit SIC through the flexible circuit board. Further, the signal between the source drive circuit SIC and the control module CTR can be LVDS (low voltage differential signal) signal or mini LVDS signal, so as to reduce signal crosstalk.

Of course, in other embodiments of the present disclosure, the liquid crystal display panel PNL may also have other structures, for example, the gate driving circuit GOA may not be provided on the array substrate but an additional gate driving circuit board may be bound; for another example, the array substrate are provided with gate driving circuits GOA on both sides of the row direction to reduce the voltage drop of the scanning signal or increase the scanning frequency; for another example, source driving circuit SIC are provided on both ends of the array substrate in the column direction to drive both sides of the liquid crystal display panel PNL, reducing the voltage drop on the data line DW in the large-size liquid crystal display panel PNL, especially reducing the voltage drop on the data line DW in the splicing screen. For another example, the source driving circuit SIC may not be disposed on the liquid crystal display panel PNL, but disposed on a COF (chip on film). The present disclosure does not limit the relative positional relationship and arrangement form between the source driving circuit SIC and the liquid crystal display panel PNL, as long as the source driving circuit SIC can directly drive each pixel of the display region of the liquid crystal display panel PNL.

Figure 3:
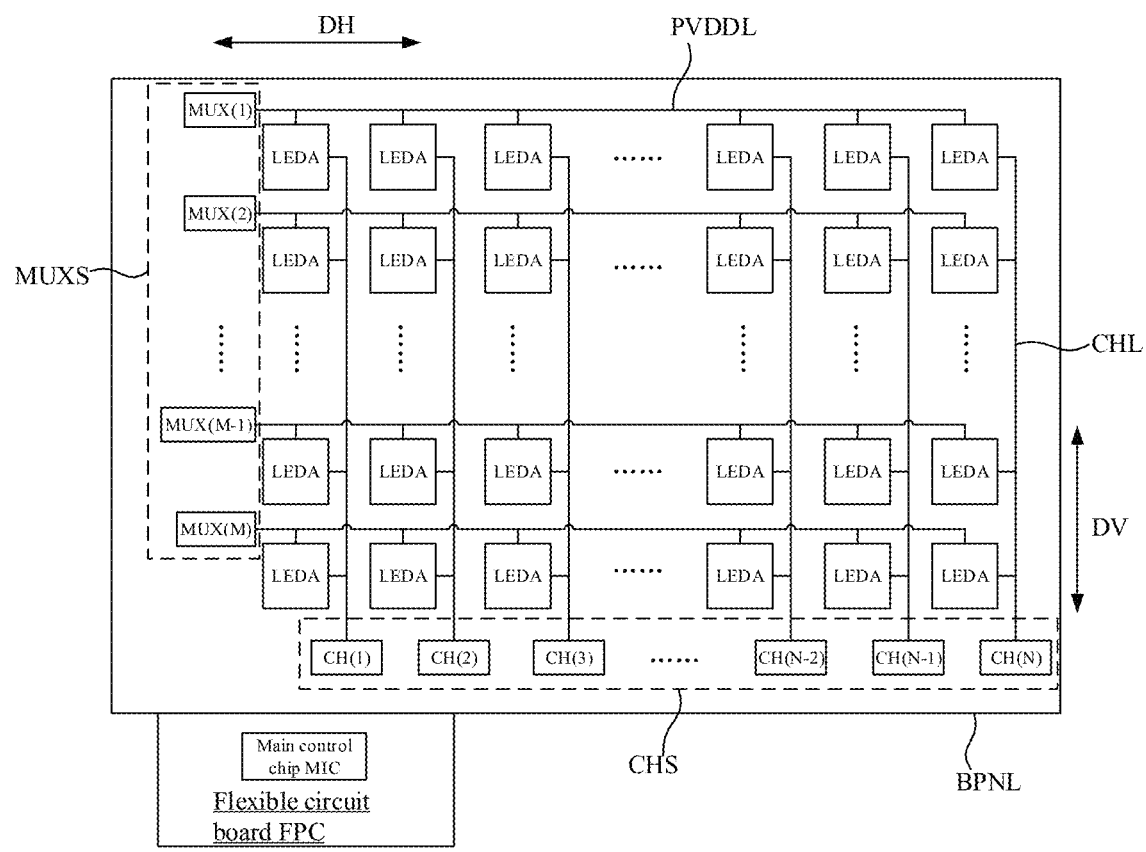
FIG. 3 is a schematic structural diagram of a light emitting module in some embodiments of the present disclosure.

The backlight module BLU in an example embodiment of the present disclosure includes a light emitting substrate BPNL. FIG. 3 illustrates some embodiments of the architecture of a light emitting substrate BPNL in the present disclosure. Referring to FIG. 3, at least one lamp region (each lamp region is provided with a light emitting circuit LEDA) may be provided on the light emitting substrate BPNL, for example, more than one lamp region distributed in an array may be provided. In one example, each lamp region is distributed in an array, for example, distributed into more than one lamp region row and more than one lamp region column; each lamp region row includes more than one lamp region arranged along the row direction; each lamp region column includes more than one lamp region arranged in the column direction. In this way, the backlight module BLU can exhibit good uniformity of light emission, and facilitate the testing of the backlight module BLU.

Among them, one or more light emitting element (such as a Mini LED or Micro LED) is provided in each lamp region. When there are more than one light emitting element in the same lamp region, these light emitting elements can be connected in series, parallel or mixed in series and parallel, so that each light emitting element can be driven, for example, each light emitting element is in the electric path with same current amplitude, in which more than one light emitting element in the electric path constitutes the light emitting circuit LEDA. In the present disclosure, the CTR controls the overall brightness of the lamp region by driving the brightness of each light emitting element in the lamp region. Optionally, under the control of the control module CTR, the brightness of each light emitting element in the lamp region is controlled, and then the brightness of the lamp region is controlled, so that the brightness of the backlight module BLU cooperates with the screen of the liquid crystal display panel PNL to improve the display effect, such as increasing the contrast.

The light emitting substrate BPNL is further provided with more than one light source voltage line PVDDL extending along a first direction and more than one channel line CHL extending along a second direction. Among them, one of the first direction and the second direction is the row direction DH, and the other is the column direction DV. For example, referring to the example in FIG. 3, the light emitting substrate BPNL is further provided with more than one light source voltage line PVDDL extending along the row direction DH and more than one channel line CHL extending along the column direction DV. Among them, an end of any light emitting circuit LEDA is connected to the light source voltage line PVDDL and the other end is connected to the channel line CHL. In this way, when the light source voltage line PVDDL connected to a light emitting circuit LEDA is loaded with a light source voltage PVDD, and when the channel line CHL connected to the light emitting circuit LEDA is electrically connected to the ground voltage line, an electrical path is formed among the light source voltage line PVDDL, the light emitting circuit LEDA and the ground voltage line, so that the driving current passes through the light emitting circuit LEDA to drive the light emitting circuit LEDA to emit light.

In an example, the light emitting substrate BPNL includes 72*8 light emitting circuits LEDA (that is, 72*8 lamp regions). In this way, the light emitting substrate BPNL can be provided with 72 channel lines CHL to drive 72 columns of light emitting circuits LEDA; 8 light source voltage lines PVDDL can be provided to drive 8 rows of light emitting circuits LEDA.

In the liquid crystal display device of the embodiments of the present disclosure, the control module CTR may include a data processing module and a driving assembly that directly drives the light emitting module. Among them, the data processing module can receive screen data and process the screen data to obtain screen synchronization data and backlight synchronization data. The screen synchronization data may be sent to the source driving circuit of the light emitting substrate BPNL to drive the light emitting substrate BPNL to display a screen. The backlight synchronization data may be sent to the driving assembly, so that the driving assembly drives the light emitting substrate BPNL according to the obtained backlight synchronization data.

In the related art, the driving chip for driving the light emitting substrate BPNL simultaneously drives each light source voltage line PVDDL and each channel line CHL. Specifically, the driving chip is provided with a first pin in one-to-one correspondence to each light source voltage line PVDDL and a second pin in one-to-one correspondence to each channel line CHL; each first pin is electrically connected to the corresponding light source through lines; and each second pin is electrically connected to the corresponding channel line CHL through lines. When the driving chip is provided on the flexible circuit board FPC and the flexible circuit board FPC is bound to the light emitting substrate BPNL, a large number of pins need to be provided on the flexible circuit board FPC and the light emitting substrate BPNL, which increases the difficulty of bonding the flexible circuit board FPC and the light emitting substrate BPNL, makes the light emitting substrate BPNL have a larger fan-out line region, which is not conducive to reducing the frame of the light emitting substrate BPNL. If the driving chip is directly bound on the light emitting substrate BPNL, the driving chip has a larger area and occupies a larger space, which will still make the fan-out line region of the light emitting substrate BPNL larger, which is not conducive to reducing the frame of the light emitting substrate BPNL.

In view of this, embodiments of the present disclosure provide a light emitting module, which includes a light emitting substrate BPNL and a driving assembly for driving the light emitting substrate. It can be understood that the light emitting substrate in the embodiments of the present disclosure can be used not only as a lamp board of a backlight module of a liquid crystal display device, but also as a display panel directly displaying screens. As follows, taking the light emitting substrate being a lamp board as an example, the light emitting substrate and its driving assembly according to the embodiments of the present disclosure are exemplarily introduced.

Referring to FIG. 3, the driving assembly includes a main control chip MIC, a circuit selection chipset MUXS and a channel chipset CHS. Among them, the circuit selection chipset MUXS includes more than one circuit selection chip MUX that are electrically connected to each light source voltage line PVDDL in one-to-one correspondence, and the circuit selection chipset MUXS is configured to enable each circuit selection chip MUX to output the light source voltage PVDD to the connected light source voltage line PVDDL one by one, under the control of the main control chip MIC.

The channel chipset CHS includes more than one channel control chip CH, and each channel control chip CH is electrically connected to one or more channel lines CHL; the channel chipset CHS is configured to control the drive current on the connected channel line CHL, under the control of the main control chip MIC; and the light emitting circuit LEDA emits light under the drive of the driving current.

According to the driving assembly provided in the present disclosure, the main control chip MIC does not need to be provided with pins in one-to-one correspondence to each light source voltage line PVDDL and each channel line CHL, but is provided with pins for the driving circuit selection chipset MUXS and the channel chipset CHS, which can greatly reduce the number of pins of the main control chip MIC, and then facilitate to bind the main control chip MIC to the light emitting substrate BPNL directly or through the flexible circuit board FPC. The main control chip MIC does not need to directly control the light source voltage PVDD loaded to each light source voltage line PVDDL, nor does it need to directly control the driving current loaded to each channel line CHL, which can reduce the function of the main control chip MIC and further reduce the main control chip MIC area and reduce the cost of the main control chip MIC. Correspondingly, each circuit selection chip MUX needs to control the light source voltage PVDD loaded to the light source voltage line PVDDL under the direct or indirect control of the main control chip MIC; the function and structure are relatively simple, and it will not lead to setting too many signal lines and occupying a large region, etc., which will affect the frame of the light emitting substrate BPNL, and will not cause a sharp increase in cost due to the increase of the circuit selection chip MUX. Correspondingly, each channel control chip CH needs to control the driving current on the channel line CHL under the direct or indirect control of the main control chip MIC, such as controlling the PWM waveform of the driving current; the function and structure are relatively simple, and it will not lead to setting too many signal lines and occupying a large region, etc., which will affect the frame of the light emitting substrate BPNL, and will not cause a sharp increase in cost due to the increase of the channel control chip CH.

In some embodiments of the present disclosure, referring to FIG. 3, the driving assembly further includes a flexible circuit board FPC bound and connected to the light emitting substrate BPNL, and the main control chip MIC is provided on the flexible circuit board FPC. The circuit selection chip MUX and the channel control chip CH are bound to the light emitting substrate BPNL, and are electrically connected to the flexible circuit board FPC through the lines provided on the light emitting substrate BPNL. In this way, both the binding difficulty of the driving assembly and the frame of the light emitting substrate BPNL can be taken into account, and the purpose of reducing the binding difficulty and reducing the frame of the light emitting substrate BPNL can be achieved at the same time. Furthermore, the flexible circuit board FPC is bound to the back of the light emitting substrate BPNL, that is, the flexible circuit board FPC and the light emitting circuit LEDA are located on two sides of the base substrate of the light emitting substrate BPNL. In this way, the frame of the light emitting substrate BPNL can be further reduced, and it is especially beneficial to splicing more than one different light emitting substrates BPNL to form a large-sized panel.

In some embodiments of the present disclosure, the circuit selection chip MUX and the channel control chip CH can also be bound to the back of the light emitting substrate BPNL, that is, the circuit selection chip MUX and the channel control chip CH can be located on the side of the base substrate (such as a glass substrate) away from the light emitting circuit LEDA. Of course, the circuit selection chip MUX and the channel control chip CH can also be located on the front of the light emitting substrate BPNL, that is, the circuit selection chip MUX and the channel control chip CH can be located on the same side of the light emitting substrate BPNL as the light emitting circuit LEDA.

In some embodiments of the present disclosure, the circuit selection chipset MUXS is provided at an end of the light emitting substrate BPNL in the first direction XA; the channel chipset CHS is provided at an end of the light emitting substrate BPNL in the second direction XB. For example, referring to FIG. 3, the light source voltage line PVDDL extends along the row direction DH and the channel line CHL extends along the column direction DV, then the circuit selection chip MUX is provided at the end of the light emitting substrate BPNL in the row direction, and the channel control chip CH is provided at the end of the light emitting substrate BPNL in the column direction. For example, each circuit selection chip MUX of the circuit selection chipset MUXS is provided on the left end or the right end of the light emitting substrate BPNL, and arranged along the column direction DV. Each channel control chip CH in the channel chipset CHS is provided on the lower end of the light emitting substrate BPNL and arranged along the row direction DH.

Figure 17:
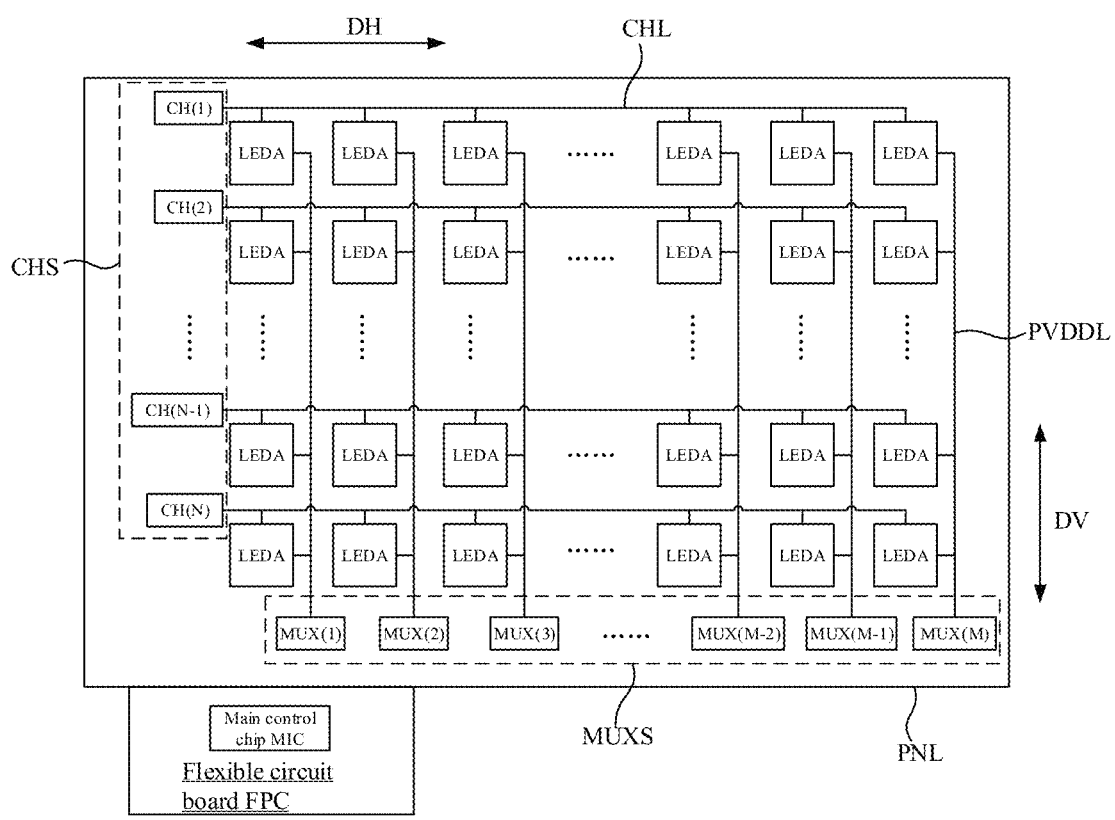
FIG. 17 is a schematic structural diagram of a light emitting module in some embodiments of the present disclosure.

In another embodiment of the present disclosure, referring to FIG. 17, the light source voltage line PVDDL may extend along the column direction DV and the channel line CHL may extend along the row direction DH. Correspondingly, the channel control chip CH is provided at the end of the light emitting substrate BPNL in the row direction, and the circuit selection chip MUX is provided at the end of the light emitting substrate BPNL in the column direction. For example, each circuit selection chip MUX of the circuit selection chipset MUXS is provided on the lower end of the light emitting substrate BPNL and arranged along the row direction DH. Each channel control chip CH in the channel chipset CHS is provided on the left end or the right end of the light emitting substrate BPNL, and arranged along the column direction DV. Such embodiment is especially suitable for those light emitting substrates BPNL that have a relatively large ratio of length (dimension along the row direction) to width (dimension along the column direction), for example, suitable for advertising screens in strip shape and the like. In such embodiment, the amount of the channel control chip CH can be reduced and the amount of the circuit selection chip MUX can be increased; since the channel control chip CH generally occupies a larger region and costs more than the circuit selection chip MUX, this method can reduce frame of the light emitting substrate BPNL and reduce the cost of the light emitting module.

In some embodiments of the present disclosure, the light emitting substrate BPNL includes a driving layer and a device layer; the driving layer is provided with various lines for driving the light emitting circuit LEDA; for example, lines such as light source voltage lines PVDDL and channel lines CHL are provided, and lines for driving the circuit selection chip MUX and the channel control chip CH are provided. The driving layer may also be provided with pads for bonding devices, and these pads are electrically connected to the lines, or serve as a part of the lines. The device layer may include various light emitting elements of the light emitting circuit LEDA, and these light emitting elements may be bonded to pads in the driving layer. When the circuit selection chip MUX and the channel control chip CH are bound to the light emitting substrate BPNL, these circuit selection chips MUX and the channel control chip CH can also be bound to the pads on the driving layer as electronic components. In this way, in the light emitting module (the light emitting substrate BPNL bound with the circuit selection chip MUX and the channel control chip CH), the electronic components in the device layer may include the light emitting element, the circuit selection chip MUX and the channel control chip CH. Certainly, according to needs, the light emitting substrate BPNL may also be provided with other electronic components, such as a temperature detection element for sensing temperature, a light detection element for detecting light intensity, and the like.

Figure 4:
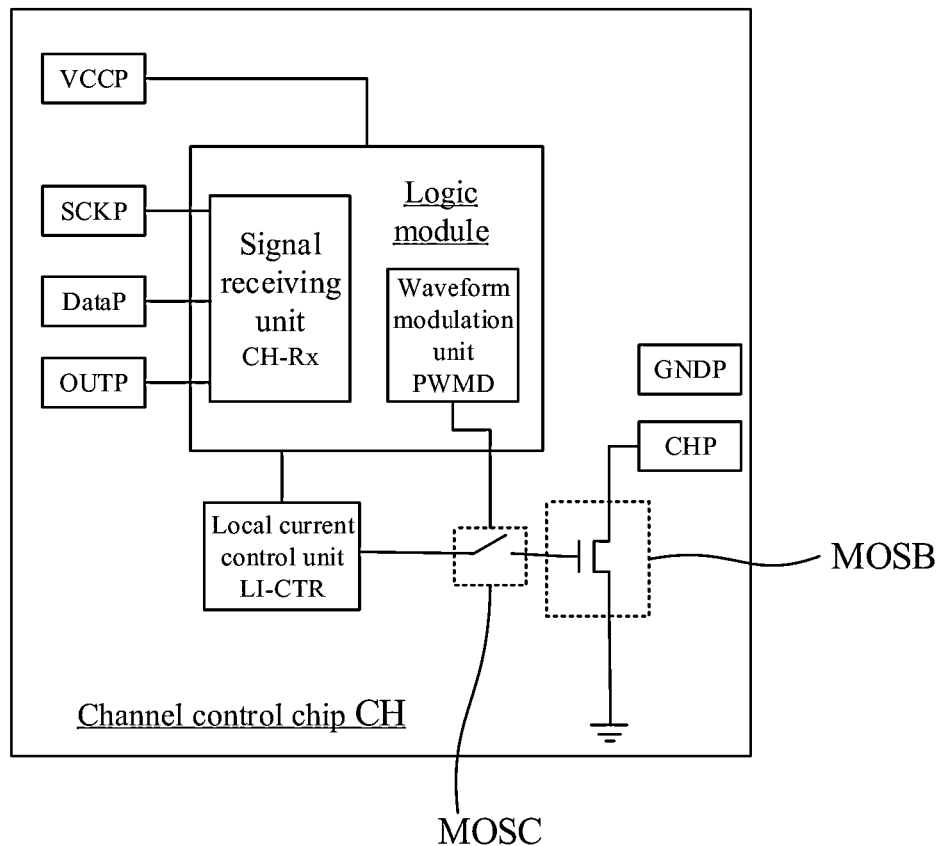
FIG. 4 is a schematic structural diagram of a channel control chip in some embodiments of the present disclosure.

In one embodiment of the present disclosure, referring to FIG. 4, the channel control chip CH is a digital chip, which includes at least one logic module. The channel control chip CH may have pins such as a chip power pin VCCP, a synchronous clock pin SCKP, a data pin DataP, an output pin OUTP, a channel pin CHP, and a wire pin GNDP.

The chip power pin VCCP of the channel control chip CH is used to load the required chip power voltage to the channel control chip CH, so that the channel control chip CH can obtain the power required for operation. In an example, the light emitting substrate BPNL is provided with a chip power line for loading the chip power voltage required by the channel control chip CH, and the chip power pin VCCP of the channel control chip CH is electrically connected to the chip power line.

The wire pin GNDP of the channel control chip CH is used to enable the channel control chip CH to load the ground voltage GND. In an example, the light emitting substrate BPNL is provided with a ground line for loading a ground voltage GND, and the wire pin GNDP of the channel control chip CH is electrically connected to the ground line.

The channel pin CHP is used to be electrically connected to the channel line CHL, so as to control the driving current on the channel line CHL.

The synchronous clock pin SCKP of the channel control chip CH is used to load the synchronous clock signal SCK, so that the channel control chip CH and the main control chip MIC maintain clock synchronization. Further, referring to FIG. 8, the main control chip MIC has a synchronous clock output pin SCKPO for outputting a synchronous clock signal SCK; referring to FIG. 5, the light emitting substrate BPNL has a synchronous clock line SCKL for loading a synchronous clock signal SCK; the synchronous clock line SCKL is electrically connected to the synchronous clock output pin SCKPO of the main control chip MIC, and is electrically connected to the synchronous clock pin SCKP of each channel control chip CH. In this way, the synchronous clock signal SCK output by the main control chip MIC can be loaded to each channel control chip CH.

The data pin DataP of the channel control chip CH is used to receive the driving data Data, so as to configure the channel control chip CH according to the received driving data Data, and then realize the control of the driving current on the channel line CHL. Among them, the channel control chip CH controlling the driving current on the channel line CHL, includes controlling the PWM waveform of the driving current on the channel line CHL. In some embodiments, the channel control chip CH controlling the driving current on the channel line CHL further includes controlling the amplitude of the drive current.

Figure 5:
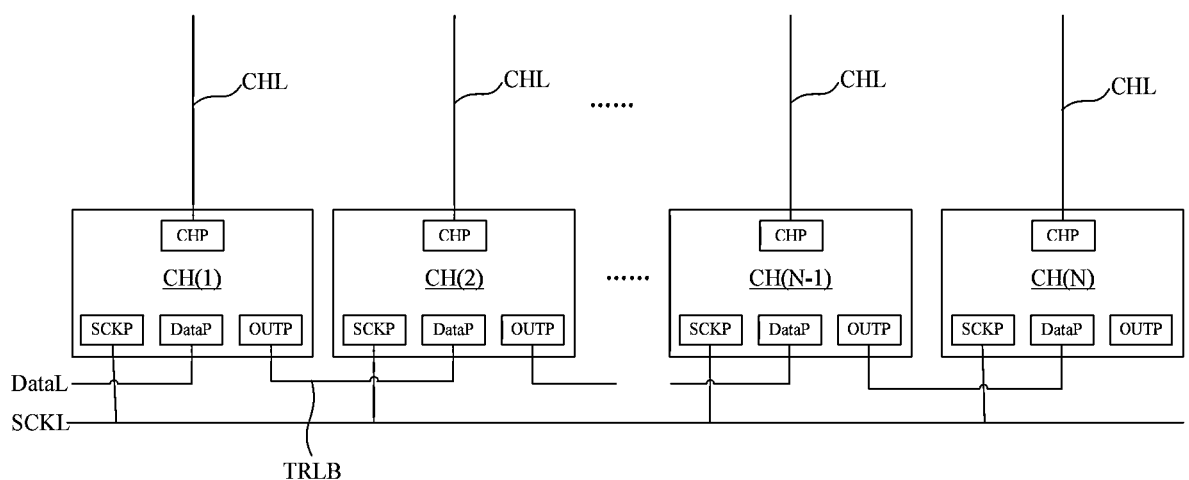
FIG. 5 is a schematic structural diagram of channel control chips in cascade in some embodiments of the present disclosure.

The output pin OUTP of the channel control chip CH is used to forward signals. When the driving data Data received by the data pin DataP of a channel control chip CH does not belong to the channel control chip CH, the channel control chip CH can forward the driving data Data through the output pin OUTP. In this way, referring to FIG. 5, more than one channel control chip CH can be cascaded in sequence, where the output pin OUTP of the channel control chip CH at an upper stage is electrically connected to the data pin DataP of the channel control chip CH at current stage (for example, electrically connected through the second connection line TRLB provided on the light emitting substrate BPNL), and the output pin OUTP of the channel control chip CH at current stage is electrically connected to the data pin DataP of the channel control chip CH at a lower stage (for example, electrically connected through the second connection line TRLB provided on the light emitting substrate BPNL); the data pin DataP of the channel control chip CH at a first stage (that is, CH(1) in FIG. 5) can be electrically connected with the data output pin DataPO of the main control chip MIC through the data line DataL provided on the light emitting substrate BPNL. In FIG. 5, CH(N) represents the channel control chip CH at the last stage, where N is the total number of channel control chips CH in the channel chipset CHS. In this way, the main control chip MIC does not need to provide a data output pin DataPO for each channel control chip CH, but can provide a data output pin DataPO for the channel chipset CHS; the data output pin DataPO can output the driving data Data required by each channel control chip CH, and these driving data Data are respectively obtained by each channel control chip CH. This can further reduce the area of the main control chip MIC and the number of pins, and reduce the number of lines required to drive the channel chipset CHS, especially reduce the line area of the lines required to drive the channel chipset CHS.

Figure 9:
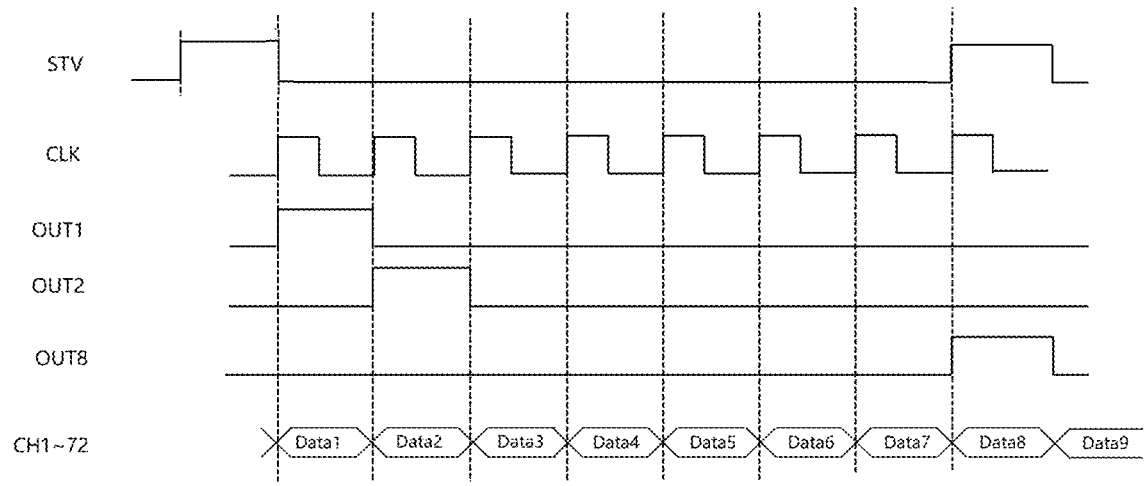
FIG. 9 is a timing diagram of the channel control chip receiving the driving data and the circuit selection chip outputting the light source voltage in some embodiments of the present disclosure.

In an example, the channel control chip CH is configured to, within a data transmission stage, obtain the received first driving data Data, and forward the subsequent driving data Data through the output pin OUTP after obtaining the driving data Data. That is, when the driving data Data is received for the first time, the driving data Data is used as the driving data Data required by the channel control chip CH, and each driving data Data received after obtaining the required driving data Data (that is, in the second The driving data Data received for the second time and subsequent times) is taken as the unnecessary driving data Data and forwarded to the channel control chip CH at the nest stage through the output pin OUTP. In this way, referring to FIG. 9, each driving data Data sent by the main control chip MIC in sequence through the data output pin DataPO can be obtained by each channel control chip CH in accordance with the cascading sequence; the first driving data Data (that is, the driving data Data1 in FIG. 9) is obtained by the channel control chip CH at the first stage (that is, CH(1) in FIG. 5), and the second driving data Data (that is, the driving data Data2 in FIG. 9) is obtained by the channel control chip CH at the scond stage (that is, CH(2)) in FIG. 5), until that the last driving data Data is obtained by the channel control chip CH at the last stage. In a further example, the size and format of each driving data Data are fixed; within a data transmission stage, after each channel control chip CH receives its own driving data Data, it transmits each driving data Data that is subsequently transmitted in to the channel control chip CH at the next stage through the output pin OUTP, thus realizing step-by-step writing of the driving data Data of the channel control chip CH.

Of course, it can be understood that in other embodiments of the present disclosure, the interaction between the main control chip MIC and the channel control chip CH can also be performed in other ways, as long as the main control chip MIC can allocate the required driving data Data to each channel control chip CH. For example, in another example, each channel control chip CH may be cascaded in sequence, and each channel control chip CH may be electrically connected to the same data line DataL for loading the driving data Data. Before allocating the driving data Data to each channel control chip CH, the main control chip MIC can perform address configuration on each channel control chip CH first, such as providing address information for the channel control chip CH at the first stage, and each channel control chip CH determining the address information of the channel control chip CH at the current stage according to the address information of the channel control chip CH at the upper stage; after the address information of each channel control chip CH is configured, the main control chip MIC can load the driving data Data of each channel control chip CH to the data line DataL, and the driving data Data of each channel control chip CH is related to the address information. The channel control chip CH can determine the address information corresponding to each driving data Data according to each driving data Data on the data line DataL, and obtain the driving data Data when the address information corresponding to the driving data Data matches with its own address information.

In some embodiments of the present disclosure, referring to FIG. 4, the channel control chip CH is provided with a signal receiving unit CH-Rx. The signal receiving unit CH-Rx is electrically connected to the synchronous clock pin SCKP, the data pin DataP and the output pin OUTP, for receiving the synchronous clock signal SCK, the driving data Data and forwarding the driving data Data.

In some embodiments of the present disclosure, the channel control chip CH is provided with at least one driving unit set, and the driving unit set at least includes a waveform modulation unit PWMD, an output control unit MOSB, and a waveform control unit MOSC.

The first end of the waveform control unit MOSC is used to load a signal capable of turning on the output control unit MOSB, the control end of the waveform control unit MOSC is electrically connected to the waveform modulation unit PWMD, and the second end of the waveform control unit MOSC is electrically connected to the control end of the output control unit MOSB. The first end of the output control unit MOSB is electrically connected to the channel pin CHP, and the second end of the output control unit MOSB is used to load the ground voltage GND. The logic module of the channel control chip CH can obtain the waveform modulation signal according to the obtained driving data Data; for example, the driving data Data obtained by the signal receiving unit CH-Rx can be extracted into a waveform modulation signal, the waveform modulation signal can be sent to the waveform modulation unit PWMD, and the waveform modulation unit PWMD controls whether the waveform control unit MOSC is turned on or not according to the waveform modulation signal. When the waveform control unit MOSC is turned on, the signal at the first end of the waveform control unit MOSC can be loaded to the control end of the output control unit MOSB so that the output control unit MOSB is turned on; when the waveform control unit MOSC is cut off, the signal at the first end of the waveform control unit MOSC cannot be loaded to the control end of the output control unit MOSB so that the output control unit MOSB is cut off. In this way, the waveform modulation unit PWMD controls the turn-on and cut-off of the waveform control unit MOSC, and then controls the turn-on and cut-off of the output control unit MOSB, thus realizing the waveform modulation of the driving current through the output control unit MOSB, and controlling the waveform of the driving current on the channel pin CHP. As an example, the waveform modulation unit PWMD can control the PWM waveform of the driving current on the channel line CHL by controlling the control end of the waveform control unit MOSC.

In this way, the main control chip MIC is configured to be able to provide the channel chipset CHS with each driving data Data required by the channel chipset CHS, the driving data Data including waveform modulation information; the channel control chip CHS can obtain the waveform modulation signal according to the obtained driving data Data, and can control the waveform of the driving current on the channel line CHL based on the waveform modulation signal.

Optionally, the waveform control unit MOSC may be a MOS transistor; the first end of the MOS transistor is used to load a signal capable of enabling the output control unit MOSB to be turned on, the second end is electrically connected to the control end of the output control unit MOSB, and the gate of the MOS transistor is electrically connected to the waveform modulation unit PWMD.

Optionally, the output control unit MOSB can be a MOS transistor; the first end of the MOS transistor is used to load the ground voltage GND, for example, it is electrically connected to the wire pin GNDP, the second end is electrically connected to the channel pin CHP, and the gate of the MOS transistor is electrically connected to the second end of the waveform control unit MOSC.

In some embodiments of the present disclosure, referring to FIG. 4, the driving unit set can be provided with a local dimming unit LI-CTR; the input end of the local dimming unit LI-CTR is electrically connected to the logic module of the channel control chip CH, the output end of the local dimming unit LI-CTR is electrically connected to the first end of the waveform control unit MOSC; the signal output by the local dimming unit LI-CTR can not only make the output control unit MOSB to be turned on, but also the local dimming unit LI-CTR can output different signals to make the current of the output control unit MOSB different when it is turned on, thus realizing the control of the channel pin CHP and the amplitude of the driving current on the channel line CHL connected to the channel pin CHP.

In an example, the logic module of the channel control chip CH can obtain the amplitude modulation signal according to the driving data Data, for example, extract the amplitude modulation signal, and the amplitude modulation signal can be sent to the local dimming unit LI-CTR. The local dimming unit LI-CTR can output different voltage signals according to the amplitude modulation signal, and the output control unit MOSB outputs different currents under the control of different voltage signals.

When the output control unit MOSB is a MOS transistor, in this example, the local dimming unit LI-CTR controls the voltage of the gate of the MOS transistor to control the magnitude of the current. The MOS transistor in the output control unit MOSB works in the saturation region, and the output of the local dimming unit LI-CTR is the gate voltage of the MOS transistor. The change of the gate voltage can control the turn-on current of the source and the drain of the MOS transistor (where, one of the source and the drain is the first end of the MOS transistor, and the other is the second end of the MOS transistor). This control method has a large control range and a simple control manner.

Figure 12:
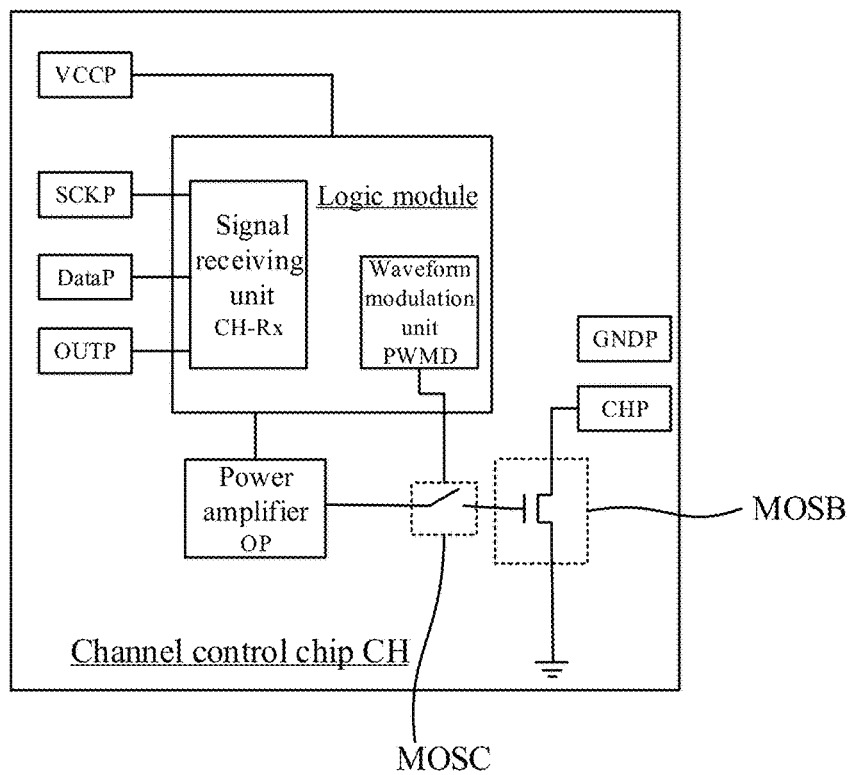
FIG. 12 is a schematic structural diagram of a channel control chip in some embodiments of the present disclosure.

In another embodiment, referring to FIG. 12, the channel control chip CH may not be provided with a local dimming unit LI-CTR to provide a signal to the first end of the waveform control unit MOSC, but may be provided with a power amplifier OP to provide a signal for the first end of the waveform control unit MOSC. Specifically, the logic module of the channel control chip CH may be electrically connected to a power amplifier OP, and the output end of the power amplifier OP is electrically connected to the first end of the waveform control unit MOSC. In this way, the power amplifier OP can provide the first end of the waveform control unit MOSC with a signal capable of making the output control unit MOSB to be turned on. In this embodiment, the power amplifier OP can improve the driving capability of the signal loaded to the first end of the waveform control unit MOSC, avoiding the problem of insufficient driving capability caused by directly using the logic module to provide signals for the waveform control unit MOSC. In this embodiment, the channel control chip CH may not be provided with a unit for modulating the amplitude of the driving current, so the channel control chip CH may not have the capability of modulating the amplitude of the current. Correspondingly, the circuit selection chip MUX may have the function of modulating the amplitude of the current on the light source voltage line PVDDL.

Certainly, the above-mentioned embodiments of the present disclosure exemplarily introduce how to realize the amplitude modulation of the driving current on the channel line CHL through the local dimming unit LI-CTR. In other embodiments of the present disclosure, other means may also be used to modulate the amplitude of the driving current on the channel line CHL.

Figure 10:
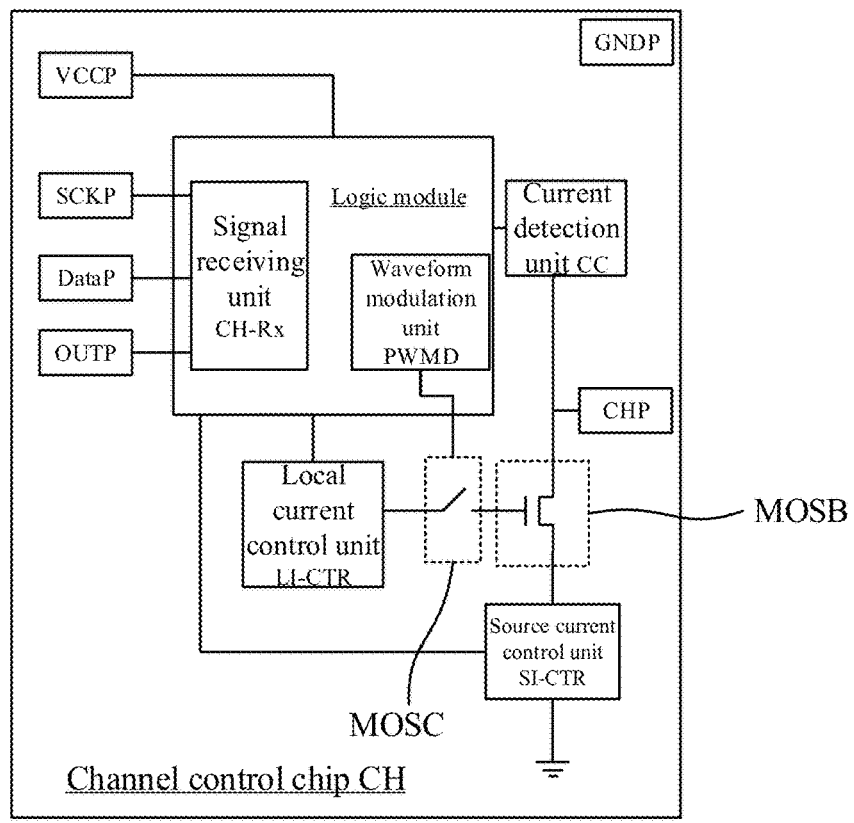
FIG. 10 is a schematic structural diagram of a channel control chip in some embodiments of the present disclosure.

In some embodiments of the present disclosure, referring to FIG. 10, the driving unit set may further be provided with a source current control unit SI-CTR on the basis of being provided with the local dimming unit LI-CTR. Among them, the first end of the source current control unit SI-CTR is electrically connected to the second end of the output control unit MOSB, the second end of the source current control unit SI-CTR is used to load the ground voltage GND, and the control end of the source current control unit SI-CTR is electrically connected to the logic module of the channel control chip CH. In this way, the logic module can generate an amplitude control signal according to the driving data Data, and the amplitude control signal can be sent to the source current control unit SI-CTR; the source current control unit SI-CTR is configured to be able to control the magnitude of the current flowing through the source current control unit SI-CTR according to the amplitude control signal. In this way, when there is a driving current in the output control unit MOSB, the driving current is controlled by the local dimming unit LI-CTR on the one hand, and also controlled by the source current control unit SI-CTR on the other hand, which significantly improves the amplitude modulation accuracy of the channel control chip CH to the driving current.

In an example, the driving unit set can also be provided with a current detection unit CC, which can detect the amplitude of the drive current on the channel pin CHP and feed it back to the logic module of the channel control chip CH; the logic module of the channel control chip CH can adjust at least one of the amplitude control signal and the amplitude modulation signal according to the feedback result of the current detection unit CC, thus further improving the modulation accuracy of the amplitude of the driving current, so that the deviation of the driving current on the channel line CHL from the target current is smaller. In this way, by providing the current detection unit CC, the problem of current inhomogeneity caused by various differences such as the process difference of the light emitting circuit LEDA connected to each channel line CHL and the process difference of the channel control chip CH itself can be overcome. The accuracy of the current amplitude of the driving current is significantly improved and the brightness uniformity of the light emitting substrate BPNL is improved. In this way, the channel control chip CH can realize precise control of the amplitude of the driving current on the channel line CHL, which is conducive to accurately controlling the brightness of each light emitting circuit LEDA, and is conducive to improving the uniformity of the display brightness of the light emitting substrate BPNL; this makes the light emitting substrate BPNL can be directly used as a display panel to display a screen.

In the example in FIG. 10, the source current control unit SI-CTR is located at the second end of the output control unit MOSB for example. In other examples of the present disclosure, the source current control unit SI-CTR may also be located in other positions, for example, the first end of the source current control unit SI-CTR may be electrically connected to the channel pin CHP, and the second end of the source current control unit SI-CTR can be electrically connected to the first end of the output control unit MOSB, and the control end of the source current control unit SI-CTR can be electrically connected to the logic module of the channel control chip CH.

In the embodiment illustrated in FIG. 10, through the cooperation of the source current control unit SI-CTR and the local dimming unit LI-CTR, the influence of the fluctuation of the process characteristics of the MOS transistor in the output control unit MOSB can be overcome, reducing the dependence on the process characteristics of MOS transistors.

In an example, the source current control unit SI-CTR may be a resistive digital-to-analog converter.

Figure 11:
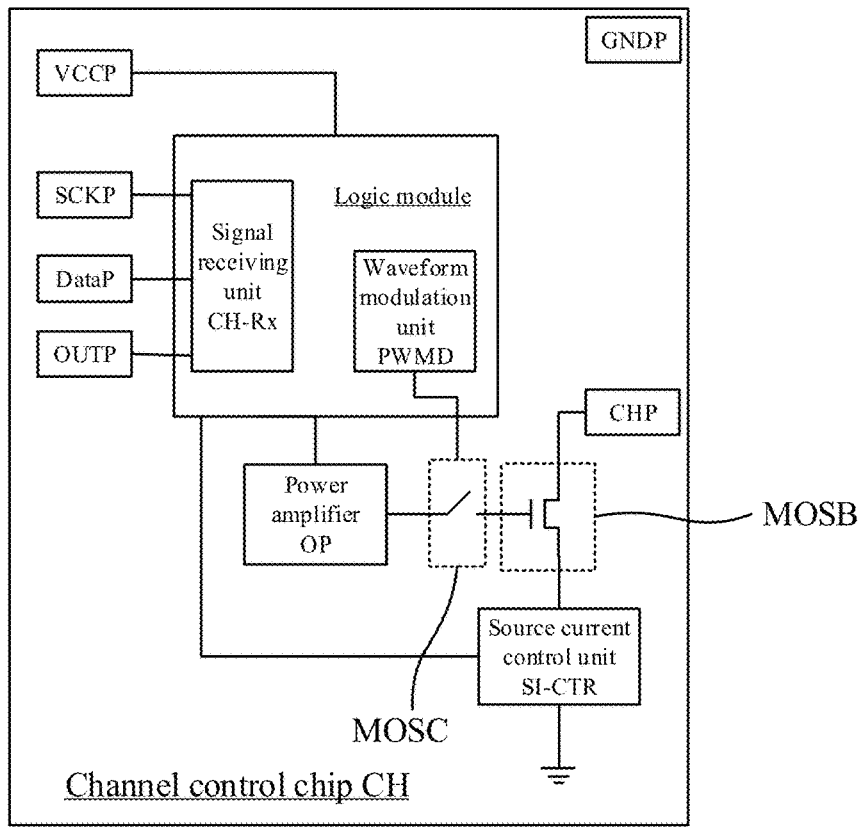
FIG. 11 is a schematic structural diagram of a channel control chip in some embodiments of the present disclosure.

In another embodiment of the present disclosure, referring to FIG. 11, the driving unit set may not be provided with a local dimming unit LI-CTR, but by providing a source current control unit SI-CTR to implement modulation of the current amplitude of the driving circuit on the channel line CHL. Referring to FIG. 11, the channel control chip CH may be provided with a power amplifier OP and a source current control unit SI-CTR. The logic module of the channel control chip CH can be electrically connected to a power amplifier OP, and the output end of the power amplifier OP is electrically connected to the first end of the waveform control unit MOSC. In this way, the power amplifier OP can provide the first end of the waveform control unit MOSC with a signal capable of turning on the output control unit MOSB. The first end of the source current control unit SI-CTR is electrically connected to the second end of the output control unit MOSB, the second end of the source current control unit SI-CTR is used to load the ground voltage GND, the control end of the source current control unit SI-CTR is electrically connected to the logic module of the channel control chip CH. In this way, the logic module can generate an amplitude control signal according to the driving data Data, and the amplitude control signal can be sent to the source current control unit SI-CTR; the source current control unit SI-CTR is configured to be able to control the magnitude of the current flowing through the source current control unit SI-CTR according to the amplitude control signal. Further, in an example, when the channel control chip CH is provided with the source current control unit SI-CTR and the power amplifier OP without being provided with the local dimming unit LI-CTR, the channel control chip CH may not be provided with the current Detection unit CC. This arrangement can simplify the channel control chip CH to reduce size and cost, and can realize the control of the current amplitude of the driving current on the channel line CHL. Especially when the light emitting substrate BPNL is used as the lamp board of the backlight module, the waveform or deviation of the current amplitude of the driving current will not have a great impact on the quality of the backlight module.

In the example in FIG. 11, the source current control unit SI-CTR is located at the second end of the output control unit MOSB for example. In other examples of the present disclosure, the source current control unit SI-CTR may also be located at other positions, for example, the first end of the source current control unit SI-CTR may be electrically connected to the channel pin CHP, the second end of the source current control unit SI-CTR can be electrically connected to the first end of the output control unit MOSB, and the control end of the source current control unit SI-CTR can be electrically connected to the logic module of the channel control chip CH.

In the above-mentioned examples of FIG. 4, FIG. 10, and FIG. 11, the driving unit set has a function of current amplitude modulation. Correspondingly, the main control chip MIC is configured to be able to provide each driving data Data required by the channel chipset CHS to the channel chipset CHS, the driving data Data including current amplitude information. The channel control chip CH can control the current amplitude of the driving current on the connected channel line CHL according to the obtained driving data Data.

Figure 16:
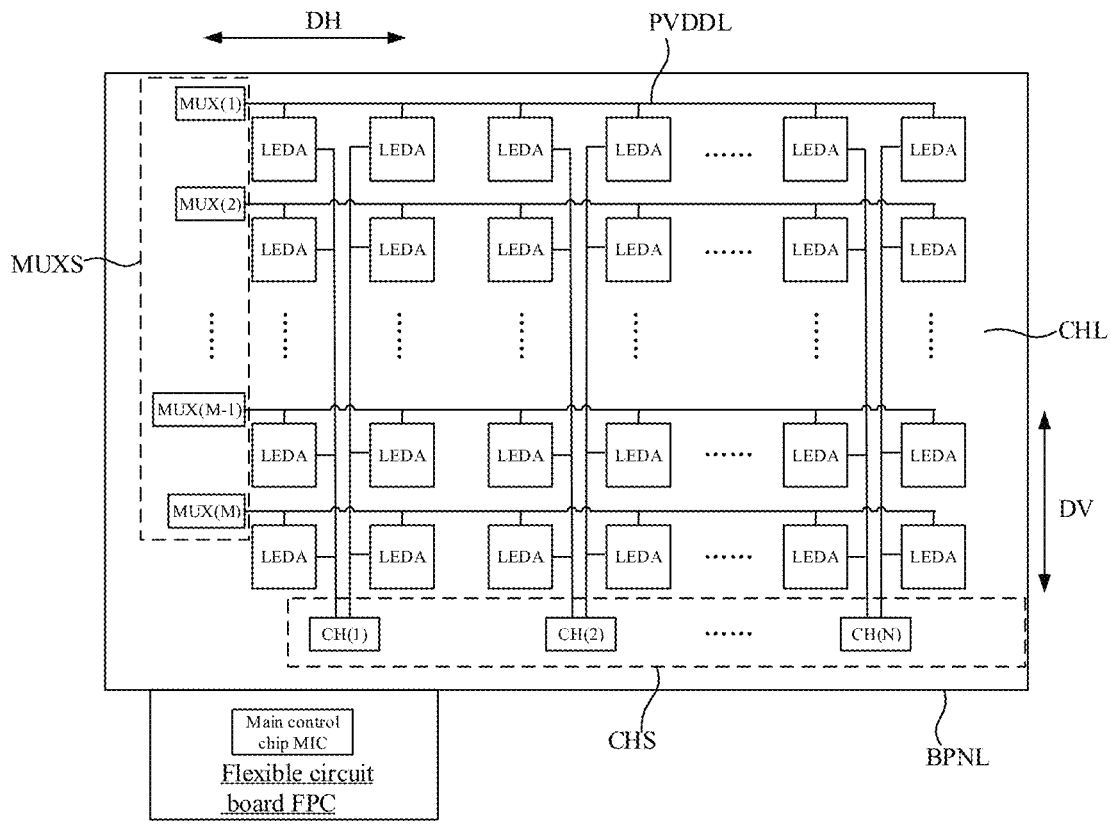
FIG. 16 is a schematic structural diagram of a light emitting module in some embodiments of the present disclosure.

In the example in FIG. 5, it is taken as an example that one channel control chip CH drives one channel line CHL. In other embodiments of the present disclosure, referring to FIG. 16, one channel control chip CH can drive more than one channel line CHL, for example, two channel lines CHL, which can reduce the number of channel control chips CH and reduce the cost of light emitting module. In the example of FIG. 16, each channel line CHL is electrically connected to a column or a row of light emitting circuits LEDA. In other embodiments of the present disclosure, a column or a row of light emitting circuits LEDA can be driven by more than one channel line CHL, for example, the odd-numbered row of light emitting circuits LEDA is electrically connected to one channel line CHL, and the even-numbered row of light emitting circuits LEDA is electrically connected to another channel line CHL.

As follows, taking one channel control chip CH driving two channel lines CHL as an example, the structure, principle and effect of the channel control chip CH capable of driving more than one channel line CHL are further exemplified.

Figure 14:
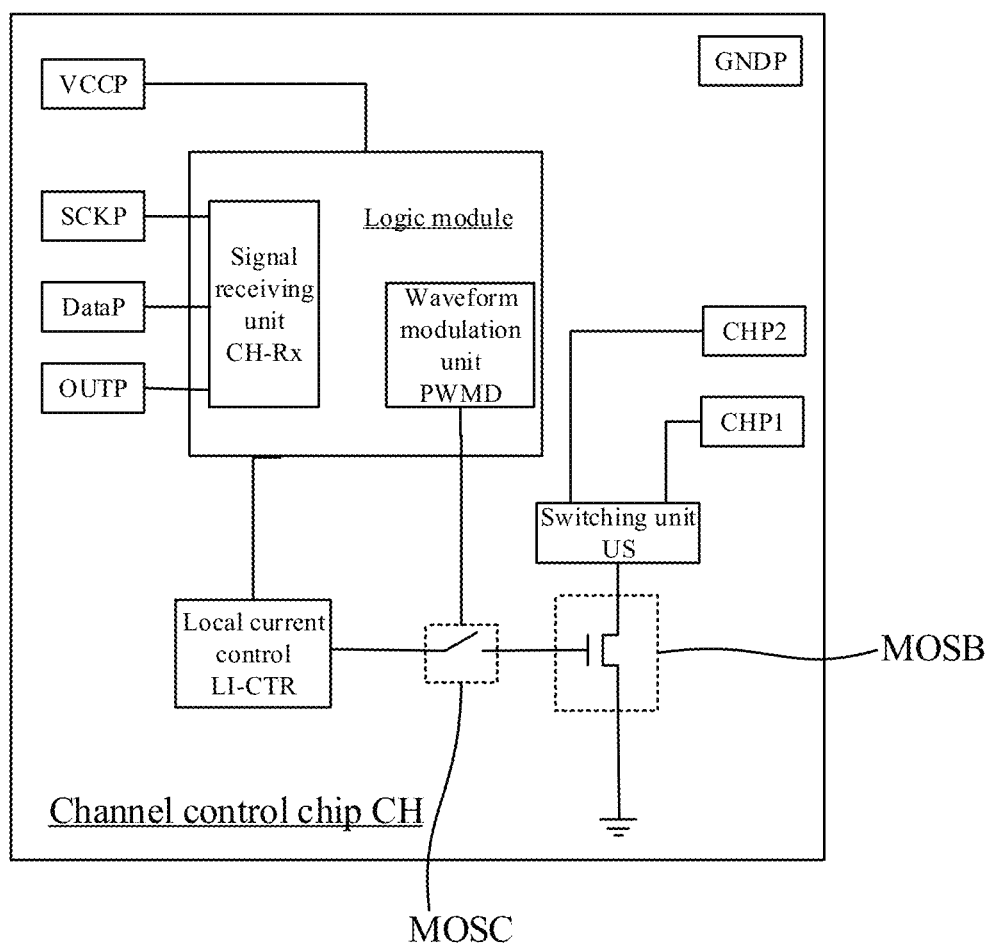
FIG. 14 is a schematic structural diagram of a channel control chip in some embodiments of the present disclosure.
Figure 15:
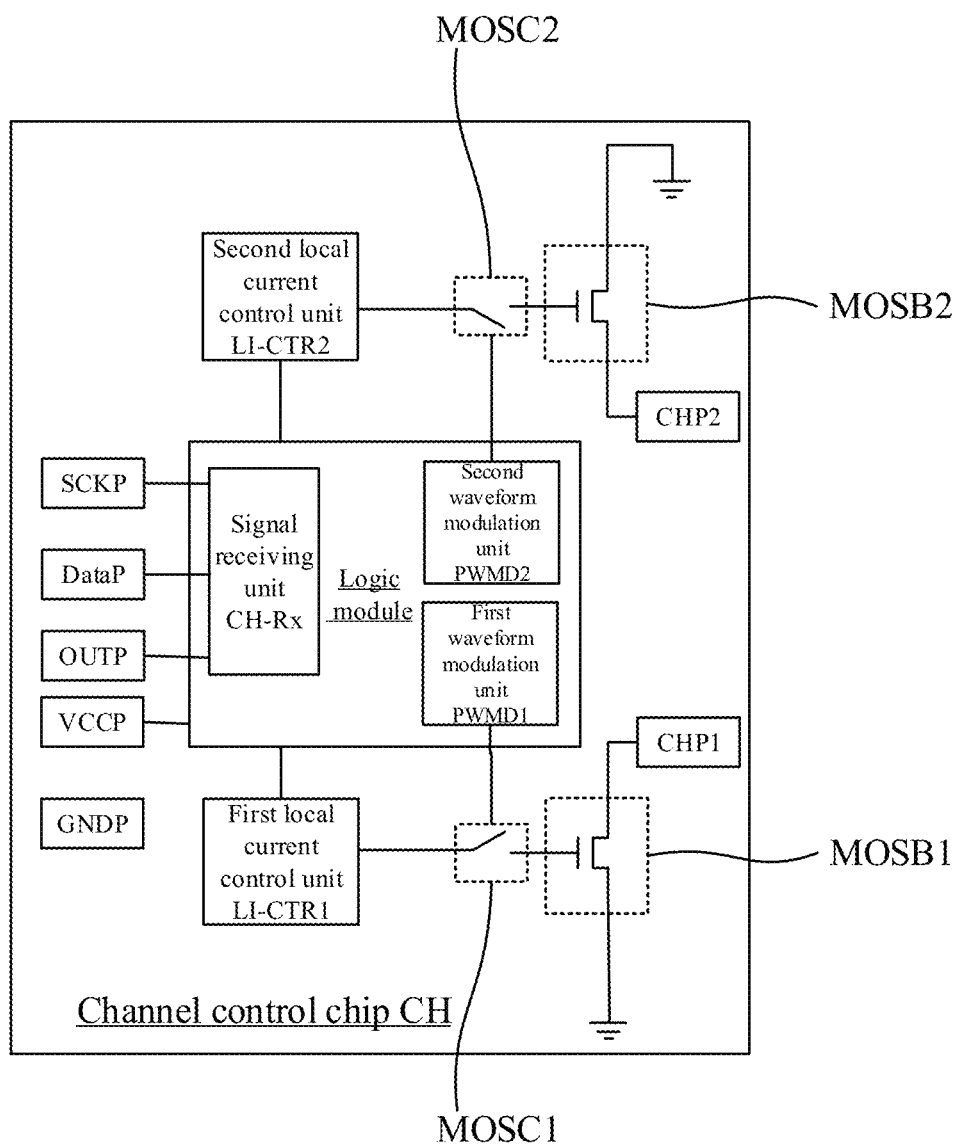
FIG. 15 is a schematic structural diagram of a channel control chip in some embodiments of the present disclosure.

Referring to FIG. 14 and FIG. 15, the channel control chip CH can be provided with more than one channel pin CHP in one-to-one correspondence to the more than one channel line CHL being driven, and each channel pin CHP is electrically connected to a channel line CHL respectively. For example, in FIG. 14 and FIG. 15, a channel control chip CH includes two pins (a first channel pin CHP1 and a second channel pin CHP2), each of which is connected to a channel line CHL.

In some embodiments of the present disclosure, referring to FIG. 14, the channel control chip CH can be provided with an output control unit MOSB, a waveform control unit MOSC and other units, and is provided with a switching unit US; the first end of the output control unit MOSB is electrically connected to the switching unit US, and each channel pin CHP is electrically connected to the switching unit US respectively. In this way, when the channel control chip CH is working, the switching unit US can make each channel pin CHP and the output control unit MOSB electrically connected one by one; when any channel pin CHP is electrically connected to the output control unit MOSB, the channel control chip CH can control the driving current on the channel line CHL connected to the channel pin CHP. In this way, when the light emitting substrate BPNL does not have a high requirement on the driving frequency, the channel control chip CH can realize the driving of more than one connected channel line CHL by driving each channel line CHL one by one.

Optionally, as needed, the channel control chip CH can also be provided with one or more of a power amplifier OP, a local dimming unit LI-CTR, a source current control unit SI-CTR, a current detection unit CC and other units. For example, in the example of FIG. 14, the channel control chip CH is provided with a local dimming unit LI-CTR to modulate the current amplitude of the driving current on each channel line CHL.

In another embodiment of the present disclosure, referring to FIG. 15, the channel control chip CH may include more than one driving unit set in one-to-one correspondence to the more than one channel line CHL being driven, and each driving unit set is used to drive the corresponding channel line CHL. Among them, each driving unit set may include a waveform modulation unit PWMD, a waveform control unit MOSC, an output control unit MOSB and a channel pin CHP. Of course, each driving unit set may also include one or more of a power amplifier OP, a local dimming unit LI-CTR, a source current control unit SI-CTR, a current detection unit CC and other units as needed. In the example of FIG. 15, each driving unit set includes a first local dimming unit LI-CTR1. It can be understood that, in some other embodiments of the present disclosure, some units in the driving unit set may be shared. For example, if more than one driving unit set is each provided with a power amplifier OP, these power amplifiers OP can be a same power amplifier OP, of course, can also be used by each driving unit set independently.

Taking the channel control chip CH shown in FIG. 15 as an example, the channel control chip CH includes two driving unit sets. The first driving unit set includes the first waveform modulation unit PWMD1, the first local dimming unit LI-CTR1, the first waveform control unit MOSC1, the first output control unit MOSB1 and the first channel pin CHP1. The first channel pin CHP1 is used to connect a channel line CHL. The second driving unit set includes the second waveform modulation unit PWMD2, the second local dimming unit LI-CTR2, the second waveform control unit MOSC2, the second output control unit MOSB2 and the second channel pin CHP2. The second channel pin CHP2 is used to connect a channel line CHL.

Figure 6:
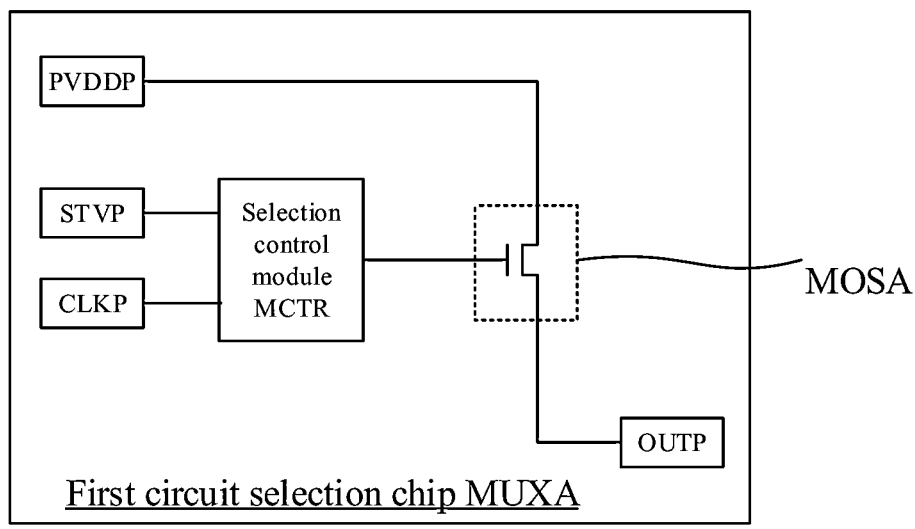
FIG. 6 is a schematic structural diagram of a circuit selection chip in some embodiments of the present disclosure.

In embodiments of the present disclosure, referring to FIG. 6, the circuit selection chip MUX can be an analog chip, so as to reduce the number of signals required by the circuit selection chip MUX and reduce the number of lines required to drive the circuit selection chip MUX, which is beneficial to reduce the frame of the light emitting substrate BPNL. The circuit selection chip MUX in the form of an analog chip may be referred to as a first circuit selection chip MUXA in the present disclosure. In this setting mode, the first circuit selection chip MUXA chip can work without additional power, and the light emitting substrate BPNL does not need to be specially provided with chip power line and ground voltage line for providing power for the first circuit selection chip MUXA.

Optionally, the first circuit selection chip MUXA may include a selection control module MCTR and a voltage output unit MOSA, and is provided with a column start signal pin STVP, a clock pin CLKP, a light source voltage input pin PVDDP, an output pin OUTP, etc. Among them, the selection control module MCTR is electrically connected with the column starting signal pin STVP, the clock pin CLKP and the control end of the voltage output unit MOSA, and the first end of the voltage output unit MOSA is electrically connected with the light source voltage input pin PVDDP, and the second end of the voltage output unit MOSA is electrically connected to the output pin OUTP.

The clock pin CLKP is used to load the clock signal CLK to the selection control module MCTR of the first circuit selection chip MUXA. In one example, referring to FIG. 7 and FIG. 8, the main control chip MIC has a clock output pin CLKPO, the light emitting substrate BPNL is provided with a clock line CLKL for loading a clock signal CLK, and the clock pin CLKP of each first circuit selection chip MUXA is electrically connected to the clock line CLKL, and the clock output pin CLKPO can load the clock signal CLK to the clock line CLKL.

The light source voltage input pin PVDDP is used to receive the light source voltage PVDD. In one example, the main control chip MIC has a light source voltage output pin PVDDPO for outputting the light source voltage PVDD, the light emitting substrate BPNL has a light source voltage distribution line PVDDLx for transmitting the light source voltage PVDD. The light source voltage input pin PVDDP of each first circuit selection chip MUXA is electrically connected to the light source voltage distribution line PVDDLx. Certainly, in another example, the flexible circuit board FPC can provide the light source voltage PVDD to the light source voltage distribution line PVDDLx, for example, the power management chip provided on the flexible circuit board FPC can provide the light source voltage PVDD to the light source voltage distribution line PVDDLx.

The output pin OUTP of the first circuit selection chip MUXA is used to be electrically connected to the connected light source voltage line PVDDL, so that the first circuit selection chip MUXA loads the light source voltage PVDD to the light source voltage line PVDDL.

The column start signal pin STVP of the first circuit selection chip MUXA is used to load the column start signal STV to the selection control module MCTR of the first circuit selection chip MUXA. The selection control module MCTR is configured to, under the control of the clock signal CLK and the column start signal STV, control the voltage output unit MOSA so that the light source voltage PVDD loaded to the light source voltage input pin PVDDP can be loaded to the output pin OUTP, furthermore, the output pin OUTP outputs the light source voltage PVDD. For example, referring to FIG. 9, after receiving the column start signal STV, the first circuit selection chip MUXA outputs the light source voltage PVDD in the next clock cycle. Further, the column start signal STV is a high level signal.

Figure 7:
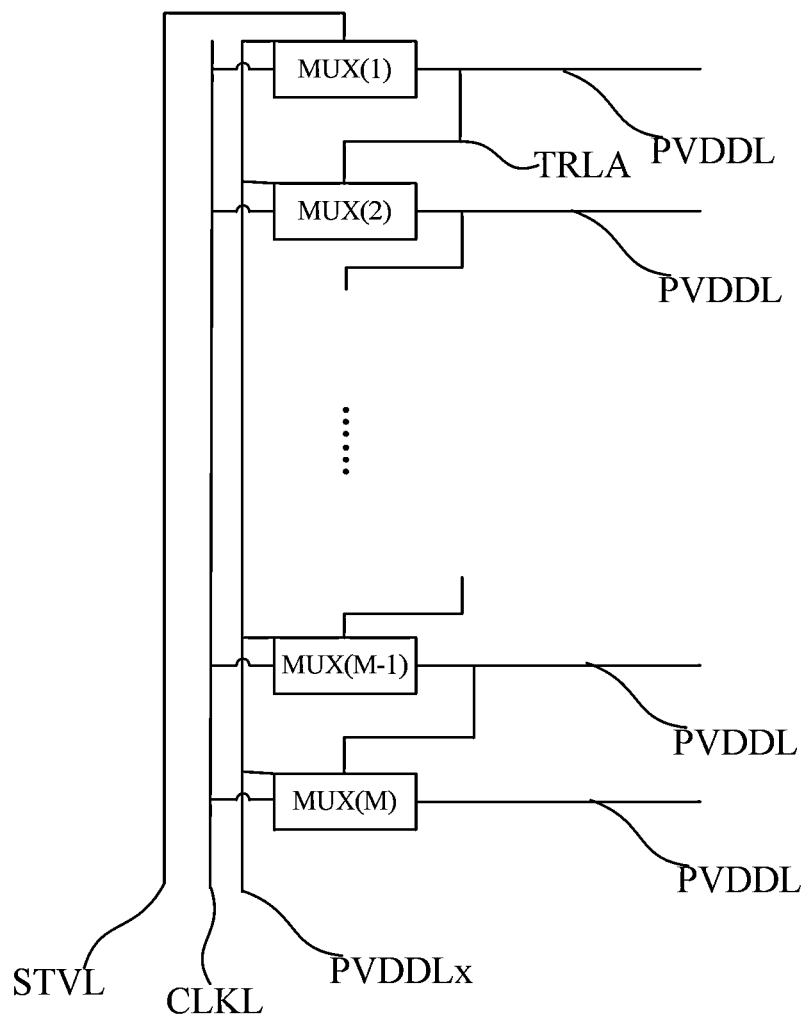
FIG. 7 is a schematic structural diagram of circuit selection chips in cascade in some embodiments of the present disclosure.

In one example, referring to FIG. 7, in the circuit selection chipset MUXS, each first circuit selection chip MUXA is cascaded in sequence, so that the output pin OUTP of each first circuit selection chip MUXA sequentially outputs the light source voltage PVDD according to the cascade sequence. In this way, it is possible to further reduce the lining area of the lines required by the circuit selection chipset MUXS, and further facilitate the reduction of the frame of the light emitting substrate BPNL.

Among them, the main control chip MIC may be provided with a column start signal output pin STVPO for outputting the column start signal STV, and the light emitting substrate BPNL may be provided with a column start signal line STVL for transmitting the column start signal STV. The column start signal pin STVP of the first circuit selection chip MUXA at the first stage (i.e., the circuit selection chip MUX(1) in FIG. 7) may be electrically connected to the column start signal line STVL for loading the column start signal STV. In this way, the main control chip MIC can control the output of the first circuit selection chip MUXA at the first stage by loading the column start signal STV to the first circuit selection chip MUXA at the first stage. In first circuit selection chips MUXA at two adjacent stages, the output pin OUTP of the first circuit selection chip MUXA at the upper stage is electrically connected with the column start signal pin STVP of the first circuit selection chip MUXA at the lower stage (for example, being electrically connected by the first connection line TRLA provided on the light emitting substrate BPNL). In this way, the output of the first circuit selection chip MUXA of at the upper stage can be used as the column start signal STV of the first circuit selection chip MUXA at the lower stage, until that the column start signal pin STVP of the first circuit selection chip MUXA at the last stage (that is, the circuit selection chip MUX (M) in FIG. 7, where M is the total number of circuit selection chips MUX in the circuit selection chipset MUXS), is electrically connected to the output pin OUTP of the first circuit selection chip MUXA at the upper stage. Further, referring to FIG. 9, the column start signal STV is a high-level signal with a length of one clock cycle.

Figure 13:
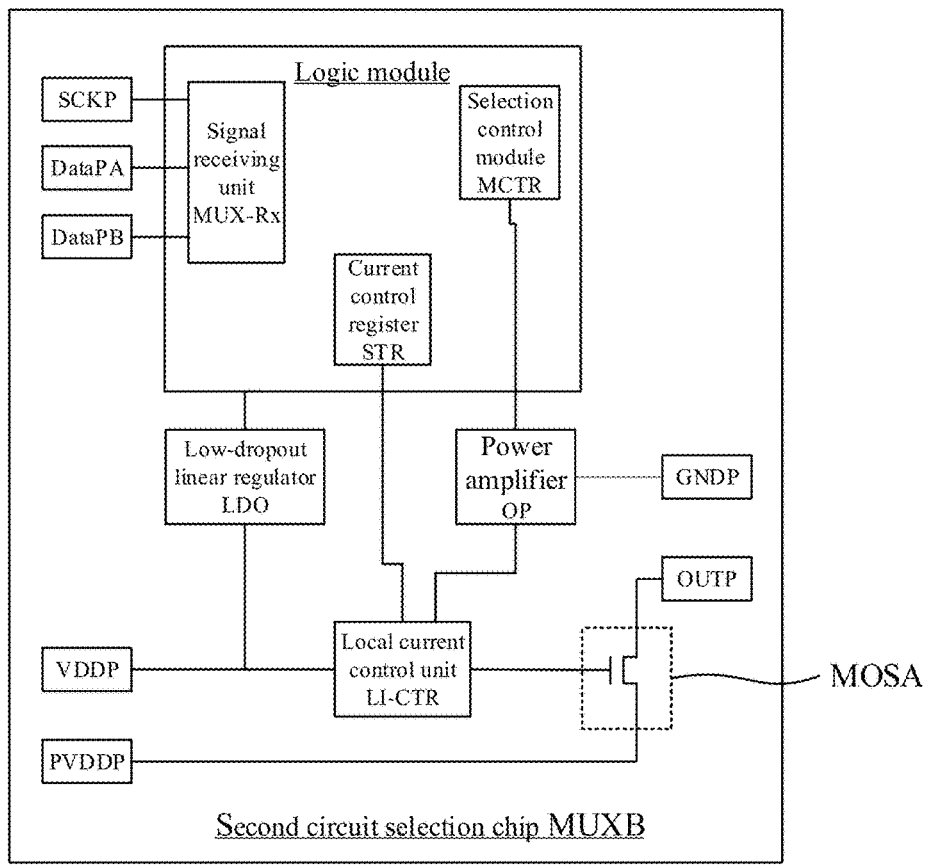
FIG. 13 is a schematic structural diagram of a circuit selection chip in some embodiments of the present disclosure.

In another embodiment of the present disclosure, referring to FIG. 13, the circuit selection chip MUX may be a digital chip, that is, the circuit selection chip MUX has a logic module. In this way, although the number of lines required to drive the circuit selection chip MUX increases, the circuit selection chip MUX can be made to have a smaller area and be configured with stronger functions when necessary, which reduces the impact on the area occupied by the driving assembly when the circuit selection chip MUX is a digital chip, and will not lead to a substantial increase in the frame of the light emitting substrate BPNL. The circuit selection chip MUX in the form of a digital chip may be referred to as a second circuit selection chip MUXB in the present disclosure.

In some embodiments of the present disclosure, the second circuit selection chip MUXB may have a local current amplitude control function, so that the channel control chip CH does not need to be provided with a current control function. On the one hand, the amount of the channel control chip CH is relatively large in most cases, so transferring the local current control function of the channel control chip CH to the second circuit selection chip MUXB can simplify the channel control chip CH and reduce the area of the channel control chip CH, and then reduce the overall area of the driving assembly as a whole; in particular, the channel control chip CH does not need to integrate the driving current waveform modulation function and the driving current amplitude modulation function at the same time, so as to avoid the area of the channel control chip CH being too large. On the other hand, compared with the first circuit selection chip MUXA, the second circuit selection chip MUXB has a smaller size as a digital chip, even if the local current amplitude control function is further integrated, it will not increase the area.

Optionally, referring to FIG. 13, the second circuit selection chip MUXB includes a logic module and an output control module. The output control module is configured to output the light source voltage PVDD with a modulated current amplitude under the control of the logic module. In other words, the main control chip MIC is configured to be able to provide the synchronous clock signal SCK and each driving data Data required by the circuit selection chipset MUXS to the circuit selection chipset MUXS. The circuit selection chipset MUXS can output the light source voltage PVDD with modulated current amplitude according to the obtained driving data Data.

In one example, the logic module may include a selection control module MCTR, a signal receiving unit MUX-Rx, a current control register STR, etc. The output control module may include a power amplifier OP, a local dimming unit LI-CTR, and a voltage output unit MOSA, etc.; further, the second circuit selection chip MUXB may also include a low-dropout linear regulator LDO for supplying power to the logic module. The second circuit selection chip MUXB is provided with a light source voltage input pin PVDDP, a synchronous clock pin SCKP, a data input pin DataPA, a data output pin DataPB, a wire pin GNDP, an output pin OUTP, a substrate power voltage pin VDDP, etc.

The synchronous clock pin SCKP of the second circuit selection chip MUXB is used to load the synchronous clock signal SCK, so that the second circuit selection chip MUXB maintain clock synchronization with the main control chip MIC. Further, the main control chip MIC has a synchronous clock output pin SCKPO for outputting a synchronous clock signal SCK, and the light emitting substrate BPNL has a synchronous clock line SCKL for loading a synchronous clock signal SCK; the synchronous clock line SCKL is electrically connected with the synchronous clock output pin SCKPO of the main control chip MIC, and is electrically connected with the synchronous clock pin SCKP of each second circuit selection chip MUXB. In this way, the synchronous clock signal SCK output by the main control chip MIC can be loaded to each second circuit selection chip MUXB. In one example, the synchronous clock pin SCKP of the second circuit selection chip MUXB and the synchronous clock pin SCKP of the channel control chip CH can be connected to the same synchronous clock line SCKL, so that the second circuit selection chip MUXB, the main control chip MIC and the channel control chip CH maintain clock synchronization.

The data input pin DataPA of the second circuit selection chip MUXB is used to receive the driving data Data, so as to configure the second circuit selection chip MUXB according to the received driving data Data, for example, realize control of the light source voltage PVDD output to the output pin OUTP, especially control of the timing of the light source voltage PVDD output. Specifically, the second circuit selection chip MUXB obtains its corresponding driving data Data according to the signal on the data input pin DataPA, and controls the timing of the output pin OUTP for outputting the light source voltage PVDD according to the driving data Data. The second circuit selection chip MUXB can also control the amplitude of the current output to the light source voltage line PVDDL according to the acquired driving data Data.

The data output pin DataPB of the second circuit selection chip MUXB is used to forward the driving data Data, so that each second circuit selection chip MUXB in the circuit selection chipset MUXS can be cascaded in sequence. Specifically, the data input pin DataPA of the second circuit selection chip MUXB at the first stage can be used to receive the driving data Data from the main control chip MIC. In the second circuit selection chips MUXB at two adjacent stages, the data output pin DataPB of the second circuit selection chip MUXB at the upper stage is electrically connected with the data input pin DataPA of the second circuit selection chip MUXB at the lower stage through an adapter line. In this way, the main control chip MIC can sequentially send the driving data Data required by each second circuit selection chip MUXB to the circuit selection chipset MUXS, specifically, to the second circuit selection chip MUXB at the first stage. The signal receiving unit MUX-Rx of the second circuit selection chip MUXB is configured so that, within one signal period, the driving data Data received for the first time is the driving data Data required by the second circuit selection chip MUXB. Each driving data Data after obtaining the required driving data Data is forwarded to the second circuit selection chip MUXB at the lower stage through the data output pin DataPB. In this way, the main control chip MIC sequentially outputs the driving data Data required by each second circuit selection chip MUXB of the circuit selection chipset MUXS, and the driving data Data can be forwarded stage by stage and received by the corresponding second circuit selection chip MUXB.

The wire pin GNDP of the second circuit selection chip MUXB is used to enable the second circuit selection chip MUXB to load the ground voltage GND. In an example, the light emitting substrate BPNL is provided with a ground line for loading a ground voltage GND, and the wire pin GNDP of the second circuit selection chip MUXB is electrically connected to the ground line. Further, the wire pin GNDP of the second circuit selection chip MUXB and the wire pin GNDP of the channel control chip CH may be connected to the same ground line. The substrate power voltage pin VDDP of the second circuit selection chip MUXB is used to obtain the substrate power voltage VDD. Among them, the input end of the a low-dropout linear regulator LDO is electrically connected to the substrate power voltage pin VDDP, and the output end is electrically connected to the logic module of the second circuit selection chip MUXB; the low-dropout linear regulator LDO can perform voltage conversion on the substrate power voltage VDD to power the logic module, for example, reduce the substrate power voltage VDD to 1.8V to serve as the power supply for the logic modules.

The local dimming unit LI-CTR may include an input end, an output end and two control ends, and the input end of the local dimming unit LI-CTR is electrically connected to the substrate power voltage pin VDDP so as to use the substrate power voltage VDD as an operation power supply. The output end of the local dimming unit LI-CTR is electrically connected to the control end of the voltage output unit MOSA. The first control end of the local dimming unit LI-CTR is electrically connected to the current control register STR, and is used for controlling the magnitude of the output voltage under the control of the current control register STR. The second control end of the local dimming unit LI-CTR is electrically connected with the power amplifier OP, and is used to control whether the voltage can be output under the control of the power amplifier OP. The power amplifier OP is electrically connected to the selection control module MCTR, the first end of the voltage output unit MOSA is electrically connected to the output pin OUTP, and the second end of the voltage output unit MOSA is electrically connected to the light source voltage input pin PVDDP.

The driving data Data obtained by the second circuit selection chip MUXB can be used to obtain timing information and amplitude information, for example, the timing information and amplitude information can be extracted. Among them, the selection control module MCTR can control the power amplifier OP according to the timing information, and then control the second control end of the local dimming unit LI-CTR through the power amplifier OP; when the local dimming unit LI-CTR can output the voltage under the control of the power amplifier OP, the voltage output unit MOSA is turned on so that the second circuit selection chip MUXB can output the light source voltage PVDD; when the local dimming unit LI-CTR cannot output the voltage under the control of the power amplifier OP, the voltage output unit MOSA is cut off so that the second circuit selection chip MUXB cannot output the light source voltage PVDD. In this way, the selection control module MCTR can control the timing at which the second circuit selection chip MUXB outputs the light source voltage PVDD according to the timing information.

Further, in the circuit selection chipset MUXS, the timing information obtained by different second circuit selection chips MUXB corresponds to different times, so that different second circuit selection chips MUXB output the light source voltage PVDD at different times, for example, making each second circuit selection chip MUXB cascaded in sequence can output the light source voltage PVDD in sequence.

The amplitude information can be stored in the current control register STR; the current control register STR can control the second control end of the local dimming unit LI-CTR according to the stored amplitude information, and then control the magnitude of the voltage that the local dimming unit LI-CTR can output. The magnitude of the voltage output by the local dimming unit LI-CTR is related to the magnitude of the current of the voltage output unit MOSA when it is turned on; in this way, by controlling the output voltage of the local dimming unit LI-CTR, the magnitude of the current of the light source voltage PVDD output by the second circuit selection chip MUXB can be controlled. In one example, the voltage output unit MOSA may be a transistor operating in a saturation region.

In an example, the driving data Data sent by the main control chip MIC to the circuit selection chip MUX includes timing information and amplitude information required by the circuit selection chip MUX; the timing information is used to control the timing at which the circuit selection chip MUX outputs the light source voltage PVDD, and the amplitude information is used to control the current amplitude of the light source voltage PVDD output by the circuit selection chip MUX.

In some embodiments of the present disclosure, the light emitting substrate BPNL may be provided with a substrate power voltage line VDDL for loading the substrate power voltage VDD to the circuit selection chipset MUXS, and the flexible circuit board FPC may load the substrate power voltage VDD to the substrate power voltage line VDDL, and then load the substrate power voltage VDD to each second circuit selection chip MUXB. Further, the voltage magnitude of the substrate power voltage VDD loaded to the second circuit selection chip MUXB and the substrate power voltage VDD loaded to the main control chip MIC may be the same, of course, may also be different.

In an example, the second circuit selection chip MUXB is configured such that, within a data transmission stage, when the driving data Data is received for the first time, the driving data Data is used as the driving data required by the second circuit selection chip MUXB Data, each driving data Data received after obtaining the required driving data Data (that is, the driving data Data received for the second time and subsequent times) is tanken as undesired driving data Data and forwarded to the second circuit selection chip MUXB at the lower stage through the output pin OUTP. In this way, each driving data Data sequentially sent by the main control chip MIC through the second data output pin DataPO2 can be sequentially obtained by each second circuit selection chip MUXB according to the cascading sequence; the first driving data Data is obtained by the second The circuit selection chip MUXB at the first stage, and the N-th driving data Data is obtained by the second circuit selection chip MUXB at the N-th stage, until the last driving data Data is obtained by the second circuit selection chip MUXB at the last stage.

The above introduction to the second circuit selection chip MUXB is a feasible way of the second circuit selection chip MUXB. It can be understood that in other embodiments of the present disclosure, the second circuit selection chip MUXB can also adopt other architectures, for example, adopting different transmission logic, setting different pins, etc., as long as the second circuit selection chip MUXB is provided with a logic module and can realize output of the light source voltage PVDD stage by stage.

In the driving assembly of the light emitting module provided in the present disclosure, the main control chip MIC is used to control the circuit selection chipset MUXS and the channel chipset CHS.

Figure 8:
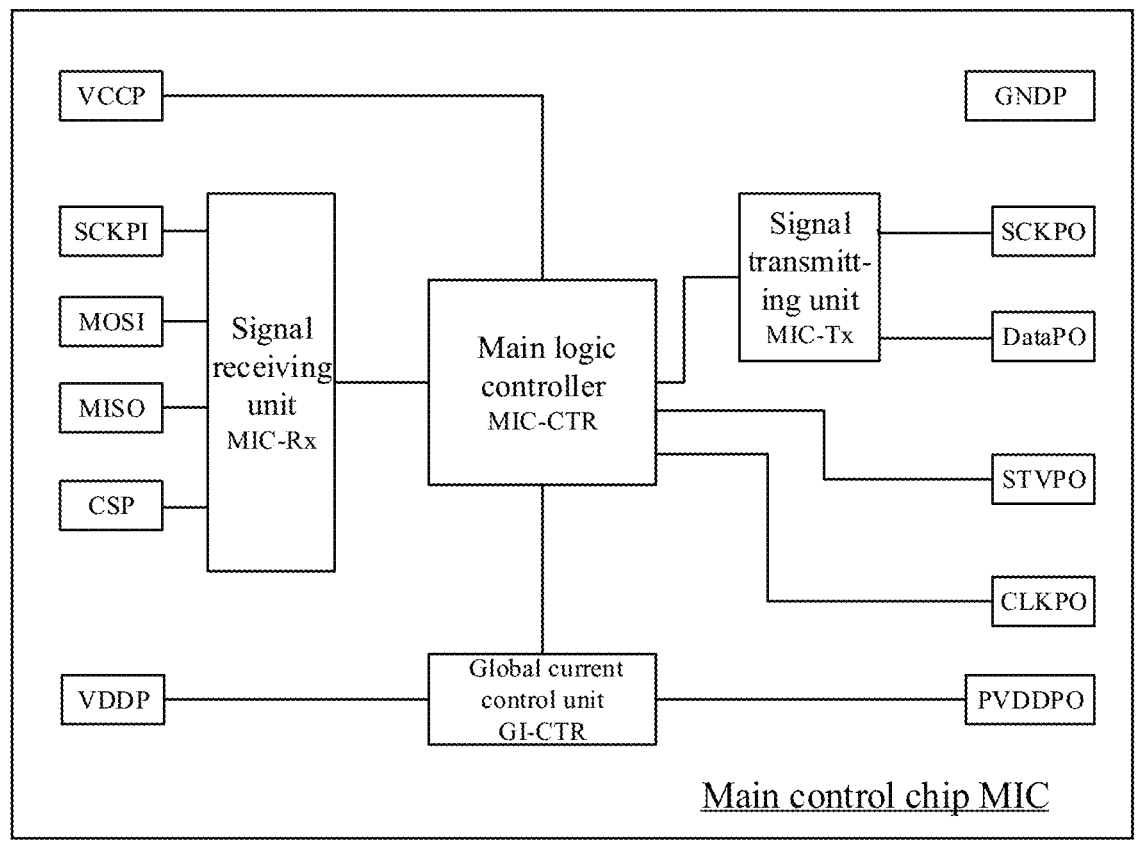
FIG. 8 is a schematic structural diagram of a main control chip in some embodiments of the present disclosure.

Referring to FIG. 8, the main control chip MIC can be provided with a main logic controller MIC-CTR, a signal receiving unit MIC-Rx, a signal transmitting unit MIC-Tx and a global current control unit GI-CTR, and be provided with various required pins.

Referring to FIG. 8, the pins of the main control chip MIC may include a synchronous clock input pin SCKPI, an input pin MOSI, an output pin MISO and a chip selection signal pin CSP, etc., electrically connected to the signal receiving unit MIC-Rx. The synchronous clock input pin SCKPI, input pin MOSI, output pin MISO and chip select signal pin CSP are used as a set of SPI interfaces of the main control chip MIC to interact with external control components, such as MCU, FPGA or SOC card board, so as to control the light emitting substrate BPNL according to the control signal provided by the external control components. For example, according to the control signal provided by the external control components a signal is sent to the channel chipset CHS and the circuit selection chipset MUXS to control the light emitting brightness of each light emitting circuit LEDA. Among them, the synchronous clock input pin SCKPI is used to receive the synchronous clock signal sent by the external control components to the main control chip MIC; the input pin MOSI is used to receive the serial data input signal, and the output pin MISO is used to output the serial data output signal, and the chip selection signal pin CSP is used to receive the chip selection signal. In this way, the data receiving module of the main control chip MIC is a data communication module using a serial synchronous communication protocol.

The main control chip MIC is provided with a chip power pin VCCP and a wire pin GNDP for supplying power to the main control chip MIC. The chip power pin VCCP is used to receive the chip power voltage VCC and provide the main control chip MIC with power required for operation, for example supplying power to the main logic control module. The wire pin GNDP is used to load the ground voltage GND to the main control chip MIC.

The global current control unit GI-CTR is connected to the substrate power voltage pin VDDP and the light source voltage output pin PVDDPO; the global current control unit GI-CTR regulates the substrate power voltage VDD under the control of the main logic controller MIC-CTR and adjust the magnitude of the current, so as to generate the light source voltage PVDD and output it to the circuit selection chip MUX through the light source voltage output pin PVDDPO.

The main logic controller MIC-CTR can receive the signals received by the signal receiving unit MIC-Rx, and generate the data and signals required by the channel chipset CHS and the circuit selection chipset MUXS according to the received signals, and transfer these data and signals directly or via the signal transmitting unit MIC-Tx to the circuit selection chipset MUXS and the channel chipset CHS. The main logic controller MIC-CTR loads the required data to the circuit selection chipset MUXS and the channel chipset CHS on the one hand, and controls the timing of the channel control chip CH and the circuit selection chip MUX on the other hand, so that the channel control chip CH and the circuit selection chip MUX cooperates in timing, thus the light emitting substrate BPNL realizes local dimming.

In some embodiments of the present disclosure, after the main logic controller MIC-CTR receives the control signals of the external control components, it can analyze the global current control signal, PWM signal and local current control signal from these signals; the global current control signal is sent to the global current control unit GI-CTR to control the current of the light source voltage PVDD output by the main control chip MIC, so as to realize global dimming, for example, to raising or lowering the overall brightness. The PWM signal and local current control signal are packaged and configured to each channel control chip CH and/or circuit selection chip MUX, and then realize the control of each channel control chip CH and circuit selection chip MUX, and finally realize the local dimming of each light emitting circuit LEDA.

In some embodiments of the present disclosure, the circuit selection chip MUX is the first circuit selection chip MUXA, then the main logic controller MIC-CTR can send the driving data Data and the synchronous clock signal SCK required by the channel chipset CHS to the channel chipset CHS through the signal transmitting unit MIC-Tx. Specifically, the main control chip MIC can be provided with a data output pin DataPO and a synchronous clock output pin SCKPO; under the control of the main logic controller MIC-CTR, the signal transmitting unit MIC-Tx can send the driving data Data required by each channel control chip CH through the data output pin DataPO to the channel chipset CHS, and the signal transmitting unit MIC-Tx sends the synchronous clock signal SCK required by each channel control chip CH to the channel chipset CHS through the synchronous clock output pin SCKPO.

The main control chip MIC can also be provided with a column start signal output pin STVPO and a clock output pin CLKPO, and the main logic controller MIC-CTR can directly send the column start signal to the circuit selection chipset MUXS through the column start signal output pin STVPO, for example, sending the column start signal STV to the column start signal pin STVP of the first circuit selection chip MUXA at the first stage; the main logic controller MIC-CTR can directly send the clock signal CLK to each circuit selection chip MUX of the circuit selection chipset MUXS through the clock output pin CLKPO.

In another embodiment of the present disclosure, the circuit selection chip MUX is the second circuit selection chip MUXB, then the main control chip MIC can send the required driving data Data and synchronous clock signal SCK to the second circuit selection chip MUXB through the signal transmitting unit MIC-Tx. Of course, the signal transmitting unit MIC-Tx that sends the driving data Data and the synchronous clock signal SCK to the channel control chip CH and the signal transmitting unit MIC-Tx that sends the driving data Data and the synchronous clock signal SCK to the circuit selection chip MUX can be the same signal transmitting unit MIC-Tx, or two different signal transmitting units MIC-Tx.

In an example, the main control chip MIC can be provided with a synchronous clock output pin SCKPO, a first data output pin DataPO1 and a second data output pin DataPO2; the synchronous clock output pin SCKPO, the first data output pin DataPO1 and the second data output pin DataPO2 are electrically connected to the same signal transmitting unit MIC-Tx. Among them, the signal transmitting unit MIC-Tx sends the synchronous clock signal SCK to the circuit selection chipset MUXS and the channel chipset CHS through the synchronous clock output pin SCKPO, and sends the driving data Data required by each channel control chip CH to the channel chipset CHS through the first data output pin DataPO1, and send the driving data Data required by each circuit selection chip MUX to the circuit selection chipset MUXS.

Other embodiments of the present disclosure will be readily apparent to those skilled in the art from consideration of the specification and practice of the present disclosure. The present disclosure is intended to cover any modification, use or adaptation of the present disclosure, and these modifications, uses or adaptations follow the general principles of the present disclosure and include common knowledge or conventional technical means in the technical field not disclosed in the present disclosure. The specification and examples are to be considered exemplary only, with the true scope and spirit of the disclosure indicated by the appended claims.

What is claimed is:

1. A driving assembly of a light emitting module, wherein, the light emitting module further comprises a light emitting substrate; the light emitting substrate comprises more than one light source voltage line extending along a first direction and more than one channel line extending along a second direction, and comprises more than one light emitting circuit distributed in an array; an end of the light emitting circuit is connected to the light source voltage line and another end is connected to the channel line; one of the first direction and the second direction is a row direction, and the other one of the first direction and the second direction is a column direction;

the driving assembly comprises a main control chip, a circuit selection chipset and a channel chipset;

the circuit selection chipset comprises more than one circuit selection chip electrically connected with the light source voltage line in one-to-one correspondence, and is configured to enable the circuit selection chip to load a light source voltage to the light source voltage line one by one, under control of the main control chip; and the channel chipset comprises more than one channel control chip, and the channel control chip is electrically connected with one or more channel lines; the channel chipset is configured to enable the channel control chip to control driving current on a channel line, under the control of the main control chip;

wherein the channel control chip comprises a synchronous clock pin, a data pin and an output pin; the channel control chip in the channel chipset is cascaded in sequence; the synchronous clock pin of the channel control chip is used to receive a synchronous clock signal from the main control chip; the data pin of the channel control chip at a first stage is used to receive driving data from the main control chip; and in channel control chips at two adjacent stages, the output pin of the channel control chip at an upper stage is electrically connected to the data pin of the channel control chip at a lower stage.

2. The driving assembly of the light emitting module according to claim 1, wherein the driving assembly further comprises a flexible circuit board bound and connected with the light emitting substrate, and the main control chip is provided on the flexible circuit board;

the circuit selection chip and the channel control chip are bound to the light emitting substrate, and are electrically connected to the flexible circuit board through a line provided on the light emitting substrate.

3. The driving assembly of the light emitting module according to claim 1, wherein the circuit selection chipset is provided on an end of the light emitting substrate in the first direction; the channel chipset is provided on an end of the light emitting substrate in the second direction;

wherein a number of the circuit selection chip in the circuit selection chipset is greater than a number of the channel control chip in the channel chipset.

4. The driving assembly of the lighting module according to claim 1, wherein the circuit selection chip is a pure analog module, comprising a selection control module and a voltage output unit; a control end of the voltage output unit is electrically connected to the selection control module, a first end of the voltage output unit is used to load the light source voltage, and a second end of the voltage output unit is electrically connected to the light source voltage line;

the selection control module is configured to enable the voltage output unit to be electrically turned on under control of a clock signal and a column start signal, so that the circuit selection chip loads the light source voltage to the light source voltage line;

wherein the main control chip is configured to provide the clock signal and the column start signal to the circuit selection chipset.

5. The driving assembly of the lighting module according to claim 4, wherein the circuit selection chip comprises a light source voltage input pin for loading the light source voltage, a clock pin for loading the clock signal, a column start signal pin for loading the column start signal and an output pin for electrical connection with the light source voltage line;

the circuit selection chip in the circuit selection chipset is cascaded in sequence; wherein, the clock pin of the circuit selection chip is used to load the clock signal from the main control chip; the column start signal pin of the circuit selection chip at a first stage is used to load the column start signal from the main control chip; in circuit selection chips at two adjacent stages, the output pin of the circuit selection chip at an upper stage is electrically connected with the column start signal pin of the circuit selection chip at a lower stage, so that output of the circuit selection chip at the upper stage is used as the column start signal of the circuit selection chip at the lower stage.

6. The driving assembly of the lighting module according to claim 1, wherein the channel control chip is configured to, within a data transmission stage, obtain the driving data, and forward subsequent driving data through the output pin after obtaining the driving data.

7. The driving assembly of the lighting module according to claim 1, wherein the channel control chip comprises at least one driving unit set, and the driving unit set comprises a waveform modulation unit, an output control unit and a waveform control unit;

a first end of the waveform control unit is used to load a voltage signal capable of turning on the output control unit electrically, a control end of the waveform control unit is electrically connected to the waveform modulation unit, and a second end of the waveform control unit end is electrically connected to a control end of the output control unit; a first end of the output control unit is electrically connected to the channel line, and a second end of the output control unit is used to load ground voltage;

a logic module of the channel control chip is configured to obtain a waveform modulation signal according to driving data being obtained; the waveform modulation unit is used to control an electrical turn-on state of the waveform control unit according to the waveform modulation signal;

wherein the driving unit set further comprises a power amplifier, an input end of the power amplifier is electrically connected to the logic module of the channel control chip, and an output end of the power amplifier is electrically connected with the first end of the waveform control unit.

8. The driving assembly of the light emitting module according to claim 7, wherein the driving unit set further comprises a source current control unit;

a first end of the source current control unit is electrically connected to a second end of the output control unit, a second end of the source current control unit is used to load the ground voltage, and a control end of the source current control unit is electrically connected to the logic module of the channel control chip;

the logic module of the channel control chip is configured to obtain an amplitude control signal according to the driving data and send to the source current control unit;

the source current control unit is used to control a magnitude of current flowing through the source current control unit according to the amplitude control signal.

9. The driving assembly of the lighting module according to claim 8, wherein the main control chip is configured to enable to provide the driving data to the channel chipset, and the driving data comprises current amplitude information;
the channel control chip is able to control current amplitude of driving current on the connected channel line according to the driving data being obtained.

10. The driving assembly of the lighting module according to claim 7, wherein the driving unit set further comprises a local dimming unit, and an input end of the local dimming unit is electrically connected to the logic module of the channel control chip, an output end of the local dimming unit is electrically connected to the first end of the waveform control unit;
the logic module of the channel control chip is configured to obtain an amplitude modulation signal according to the driving data and send to the local dimming unit;
the local dimming unit is used to output different voltage signals according to the amplitude modulation signal, so as to control a current amplitude of the output control unit when electrically turned on.

11. The driving assembly of the lighting module according to claim 10, wherein the driving unit set further comprises a source current control unit;
a first end of the source current control unit is electrically connected to a second end of the output control unit, a second end of the source current control unit is used to load the ground voltage, and a control end of the source current control unit is electrically connected to the logic module of the channel control chip;
the logic module of the channel control chip is configured to obtain an amplitude control signal according to the driving data and send to the source current control unit;
the source current control unit is used to control a magnitude of current flowing through the source current control unit according to the amplitude control signal.

12. The driving assembly of the lighting module according to claim 11, wherein the driving unit set further comprises a current detection unit;
the current detection unit is used to detect a current amplitude of the first end of the output control unit and feed back to the logic module of the channel control chip; the logic module of the channel control chip adjusts the amplitude modulation signal and/or the amplitude control signal based on feedback of the current detection unit.

13. The driving assembly of the light emitting module according to claim 7, wherein the channel control chip comprises a driving unit set and more than one channel pin for connecting different channel lines respectively; the channel control chip further comprises a switching unit;
the first end of the output control unit is electrically connected to the switching unit, and the channel pin is electrically connected to the switching unit; the switching unit is configured to enable the channel pin to be electrically connected with the switching unit one by one.

14. The driving assembly of the lighting module according to claim 7, wherein the channel control chip comprises more than one driving unit set and a channel pin corresponding to the driving unit set, and the channel pin is used to connect the channel line;
the first end of the output control unit of each driving unit set is electrically connected to the channel pin correspondingly.

15. The driving assembly of the lighting module according to claim 1, wherein the circuit selection chip comprises a logic module and an output control module;
the output control module is configured to output the light source voltage with a modulated current amplitude under control of the logic module.

16. The driving assembly of the lighting module according to claim 15, wherein the circuit selection chip comprises a synchronous clock pin, a data input pin and a data output pin;
the circuit selection chip is configured to, within a data transmission stage, obtain driving data received by the data input pin and forward subsequent driving data through the data output pin after obtaining the driving data;
the circuit selection chip in the circuit selection chipset is cascaded in sequence; wherein, the synchronous clock pin of the circuit selection chip is used to receive the synchronous clock signal from the main control chip; the data input pin of the circuit selection chip at a first stage is used to receive the driving data from the main control chip; in circuit selection chips at two adjacent stages, the data output pin of the circuit selection chip at an upper stage is electrically connected to the data input pin of the circuit selection chip at a lower stage.

17. The driving assembly of the lighting module according to claim 15, wherein the logic module of the circuit selection chip comprises a selection control module and a current control register; the output control module of the circuit selection chip comprises a power amplifier, a local dimming unit, and a voltage output unit;
wherein, an input end of the local dimming unit is used to load a substrate power voltage; an output end of the local dimming unit is electrically connected to a control end of the voltage output unit;
a first control end of the local dimming unit is electrically connected to the current control register, and is used to control magnitude of an voltage signal being output under control of the current control register, so as to control amplitude of current flowing through the voltage output unit when the voltage output unit is electrically turned on; a second control end of the local dimming unit is electrically connected to the power amplifier, and is used to output the voltage signal under control of the power amplifier; the power amplifier is electrically connected to the selection control module; a first end of the voltage output unit is electrically connected to the light source voltage line, and a second end of the voltage output unit is used to load the light source voltage;
the logic module of the circuit selection chip is configured to obtain timing information and amplitude information according to driving data being obtained; the selection control module is used to control the power amplifier according to the timing information, so as to control the circuit selection chip whether to output the light source voltage; the current control register is used to control the second control end of the local dimming unit according to the amplitude information, so as to control amplitude of current output by the circuit selection chip.

18. The driving assembly of the light emitting module according to claim 15, wherein the main control chip is configured to provide first driving data to the circuit selection chipset; the circuit selection chip is able to output a light source voltage with a modulated current amplitude according to the first driving data; wherein the first driving data comprises timing information and amplitude information required by the circuit selection chip; the timing information is used to control timing for the circuit selection chip to output the light source voltage, and the amplitude information is used to control amplitude of current output by the circuit selection chip;

the main control chip is further configured to provide second driving data to the channel chipset, and the second driving data comprises waveform modulation information; wherein, the channel control chip is able to obtain a waveform modulation signal according to the second driving data and control a waveform of driving current on the channel line based on the waveform modulation signal.

19. A light emitting module, comprising a driving assembly, wherein, the light emitting module further comprises a light emitting substrate; the light emitting substrate comprises more than one light source voltage line extending along a first direction and more than one channel line extending along a second direction, and comprises more than one light emitting circuit distributed in an array; an end of the light emitting circuit is connected to the light source voltage line and another end is connected to the channel line; one of the first direction and the second direction is a row direction, and the other one of the first direction and the second direction is a row direction is a column direction;

the driving assembly comprises a main control chip, a circuit selection chipset and a channel chipset;

the circuit selection chipset comprises more than one circuit selection chip electrically connected with the light source voltage line in one-to-one correspondence, and is configured to enable the circuit selection chip to load a light source voltage to the light source voltage line one by one under control of the main control chip; and the channel chipset comprises more than one channel control chip, and the channel control chip is electrically connected with one or more channel lines; the channel chipset is configured to enable the channel control chip to control driving current on a channel line under the control of the main control chip;

wherein the channel control chip comprises a synchronous clock pin, a data pin and an output pin; the channel control chip in the channel chipset is cascaded in sequence; the synchronous clock pin of the channel control chip is used to receive a synchronous clock signal from the main control chip; the data pin of the channel control chip at a first stage is used to receive driving data from the main control chip; and in channel control chips at two adjacent stages, the output pin of the channel control chip at an upper stage is electrically connected to the data pin of the channel control chip at a lower stage.

20. A display device, comprising a liquid crystal display panel and a backlight module, wherein the backlight module comprises a light emitting module, and the light emitting module comprises a driving assembly and a light emitting substrate; the light emitting substrate comprises more than one light source voltage line extending along a first direction and more than one channel line extending along a second direction, and comprises more than one light emitting circuit distributed in an array; an end of the light emitting circuit is connected to the light source voltage line and another end is connected to the channel line; one of the first direction and the second direction is a row direction, and the other one of the first direction and the second direction is a row direction is a column direction;

the driving assembly comprises a main control chip, a circuit selection chipset and a channel chipset;

the circuit selection chipset comprises more than one circuit selection chip electrically connected with the light source voltage line in one-to-one correspondence, and is configured to enable the circuit selection chip to load a light source voltage to the light source voltage line one by one under control of the main control chip; and the channel chipset comprises more than one channel control chip, and the channel control chip is electrically connected with one or more channel lines; the channel chipset is configured to enable the channel control chip to control driving current on a channel line under the control of the main control chip;

wherein the channel control chip comprises a synchronous clock pin, a data pin and an output pin; the channel control chip in the channel chipset is cascaded in sequence; the synchronous clock pin of the channel control chip is used to receive a synchronous clock signal from the main control chip; the data pin of the channel control chip at a first stage is used to receive driving data from the main control chip; and in channel control chips at two adjacent stages, the output pin of the channel control chip at an upper stage is electrically connected to the data pin of the channel control chip at a lower stage.

\* \* \* \* \*